US012364047B2

(12) United States Patent
Kwon et al.

(10) Patent No.: US 12,364,047 B2
(45) Date of Patent: Jul. 15, 2025

(54) IMAGE SENSOR AND METHOD OF MANUFACTURING THE SAME

(71) Applicant: SAMSUNG ELECTRONICS CO., LTD., Suwon-si (KR)

(72) Inventors: Doowon Kwon, Seongnam-si (KR); Changrok Moon, Seoul (KR); Kyungtae Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 551 days.

(21) Appl. No.: 17/721,914

(22) Filed: Apr. 15, 2022

(65) Prior Publication Data
US 2022/0392941 A1    Dec. 8, 2022

(30) Foreign Application Priority Data

Jun. 3, 2021 (KR) .................. 10-2021-0072068

(51) Int. Cl.
*H04N 25/79* (2023.01)
*H01L 23/00* (2006.01)
(Continued)

(52) U.S. Cl.
CPC .......... *H10F 39/809* (2025.01); *H01L 24/08* (2013.01); *H01L 24/80* (2013.01); *H04N 25/79* (2023.01);
(Continued)

(58) Field of Classification Search
CPC ... H01L 27/14634; H01L 24/08; H01L 24/80; H01L 27/14636; H01L 27/1469; H01L 2224/08145; H04N 25/78
See application file for complete search history.

(56) References Cited

U.S. PATENT DOCUMENTS 10,090,349 B2    10/2018    Wan et al.
10,163,946 B2    12/2018    Kwon
(Continued)

FOREIGN PATENT DOCUMENTS

JP    2018-190766 A    11/2018
JP    2020-145427 A    9/2020
(Continued)

OTHER PUBLICATIONS

Korean Patent Office dated Mar. 18, 2025, issued by the Korean Patent Office in Korean Application No. 10-2021-0072068.

*Primary Examiner* — Tony Ko
(74) *Attorney, Agent, or Firm* — Sughrue Mion, PLLC

(57) ABSTRACT

Provided is an image sensor including a first layer including a first semiconductor substrate including a pixel unit in which a plurality of unit pixels are provided, and a first wiring layer provided on the first semiconductor substrate, a second layer including a second semiconductor substrate on which a plurality of transistors configured to operate a global shutter operation are provided, and a second wiring layer provided on the second semiconductor substrate, and provided on the first layer such that the first wiring layer and the second wiring layer oppose each other in a first direction, a plurality of first bonding structures bonding the first layer to the second layer based on a first bonding metal exposed on a surface of the first wiring layer being in contact with a second bonding metal exposed on a surface of the second wiring layer, a third layer including a third semiconductor substrate on which a logic circuit is provided, and a third wiring layer provided on the third semiconductor substrate, and bonded to the second layer such that the second semiconductor substrate and the third wiring layer oppose each other in the first direction, and a plurality of second bonding structures extending from the second wiring layer, and bonding the second layer to the third layer based on a
(Continued)

bonding via penetrating the second semiconductor substrate being in contact with a third bonding metal exposed to a surface of the third wiring layer.

20 Claims, 22 Drawing Sheets

(51) Int. Cl.
 *H10F 39/00* (2025.01)
 *H04N 25/78* (2023.01)
(52) U.S. Cl.
 CPC ......... *H10F 39/018* (2025.01); *H10F 39/811* (2025.01); *H01L 2224/08145* (2013.01); *H01L 2224/80895* (2013.01); *H01L 2224/80896* (2013.01); *H04N 25/78* (2023.01)

(56) References Cited

U.S. PATENT DOCUMENTS

| | | |
|---|---|---|
| 10,403,659 B2 | 9/2019 | Gambino et al. |
| 10,573,679 B2 | 2/2020 | Kwon |
| 10,804,310 B2 | 10/2020 | Kobayashi |
| 2014/0042298 A1 | 2/2014 | Wan et al. |
| 2015/0270307 A1 | 9/2015 | Umebayashi et al. |
| 2017/0104020 A1 | 4/2017 | Lee et al. |
| 2017/0345854 A1 | 11/2017 | Kwon |
| 2019/0043903 A1 | 2/2019 | Gambino et al. |
| 2019/0103425 A1 | 4/2019 | Yoon et al. |
| 2019/0386053 A1 | 12/2019 | Amano |
| 2020/0020733 A1 | 1/2020 | Fujii et al. |
| 2020/0035736 A1 | 1/2020 | Nagahama |
| 2020/0176500 A1 | 6/2020 | Sze et al. |
| 2020/0266229 A1* | 8/2020 | Takahashi ......... H01L 27/14636 |
| 2020/0381398 A1 | 12/2020 | Lan et al. |
| 2020/0389608 A1 | 12/2020 | Baek et al. |
| 2021/0043671 A1 | 2/2021 | Yoneda et al. |
| 2021/0104571 A1 | 4/2021 | Shohji et al. |
| 2021/0118937 A1 | 4/2021 | Tsugawa |

FOREIGN PATENT DOCUMENTS

| | | |
|---|---|---|
| KR | 10-2009-0058762 A | 6/2009 |
| KR | 10-2019-0131489 A | 11/2019 |
| WO | 2020/054282 A1 | 3/2020 |

* cited by examiner

IMAGE SENSOR AND METHOD OF MANUFACTURING THE SAME

CROSS TO REFERENCE TO RELATED APPLICATION

This application claims priority to Korean Patent Application No. 10-2021-0072068 filed on Jun. 3, 2021 in the Korean Intellectual Property Office, the disclosure of which is incorporated herein by reference in its entirety.

BACKGROUND

Example embodiments of the present disclosure relate to an image sensor and a method of manufacturing the same.

An image sensor may be a semiconductor-based sensor receiving light and generating an electrical signal, and may include a pixel array having a plurality of unit pixels, and a circuit for driving the pixel array and generating an image. The plurality of unit pixels may include a photodiode generating electric charges in response to external light, and a pixel circuit converting electric charge generated by the photodiode into an electric signal. The image sensor may be widely applied to a smartphone, a tablet personal computer (PC), a laptop computer, a television, a vehicle, and the like, in addition to a camera for taking pictures or videos. Recently, research into a method of disposing a plurality of devices to improve performance of an image sensor has been conducted.

SUMMARY

One or more example embodiments provide an image sensor having a stack structure including a first layer in which a pixel unit is formed, a second layer in which a circuit for implementing a global shutter operation is formed, and a third layer in which a logic circuit is formed, and having an improved bonding structure.

According to an aspect of an example embodiment, there is provided an image sensor, including a first layer including a first semiconductor substrate including a pixel unit in which a plurality of unit pixels are provided, and a first wiring layer provided on the first semiconductor substrate, a second layer including a second semiconductor substrate on which a plurality of transistors configured to operate a global shutter operation are provided, and a second wiring layer provided on the second semiconductor substrate, and provided on the first layer such that the first wiring layer and the second wiring layer oppose each other in a first direction, a plurality of first bonding structures bonding the first layer to the second layer based on a first bonding metal exposed on a surface of the first wiring layer being in contact with a second bonding metal exposed on a surface of the second wiring layer, a third layer including a third semiconductor substrate on which a logic circuit is provided, and a third wiring layer provided on the third semiconductor substrate, and bonded to the second layer such that the second semiconductor substrate and the third wiring layer oppose each other in the first direction, and a plurality of second bonding structures extending from the second wiring layer, and bonding the second layer to the third layer based on a bonding via penetrating the second semiconductor substrate being in contact with a third bonding metal exposed to a surface of the third wiring layer.

According to another aspect of an example embodiment, there is provided an image sensor, including a first layer including a first semiconductor substrate including a pixel unit in which a plurality of unit pixels are provided, and a first wiring layer provided on the first semiconductor substrate, a second layer including a second semiconductor substrate and a second wiring layer provided on the second semiconductor substrate, and bonded to the first layer such that the first wiring layer and the second wiring layer oppose each other in a first direction, and a third layer including a third semiconductor substrate and a third wiring layer provided on the third semiconductor substrate, and bonded to the second layer based on a third bonding metal exposed to a surface of the third wiring layer being in contact with a bonding via penetrating the second semiconductor substrate in the first direction, wherein the bonding via includes an upper via region in contact with a second wiring included in the second wiring layer and having a first width in a second direction perpendicular to the first direction, and a lower via region in contact with the third bonding metal and having a second width greater than the first width in the second direction.

According to another aspect of an example embodiment, there is provided an image sensor, including a first layer, a second layer, and a third layer bonded to each other in that order in a first direction, each of the first layer, the second layer, and the third layer including a semiconductor substrate and a wiring layer provided on the semiconductor substrate in a first direction, and divided into a plurality of regions in a second direction and a third direction perpendicular to the first direction, wherein the plurality of regions include a first region in which the first layer includes a first semiconductor substrate in which a pixel unit is provided, and the second layer includes a second semiconductor substrate, a second region in which the first layer is bonded to the second layer by a first bonding structure, and the second layer is bonded to the third layer by a second bonding structure, and a third region includes at least one of a first through-silicon via extending from a surface exposed to the first semiconductor substrate and connected to a first wiring included in a first wiring layer included in the first layer, and a second through-silicon via extending from a surface exposed to a third semiconductor substrate included in the third layer and connected to a third wiring included in a third wiring layer included in the third layer.

According to another aspect of an example embodiment, there is provided a method of manufacturing an image sensor, the method including forming a first layer including a first semiconductor substrate including a pixel unit in which a plurality of unit pixels are provided, and a first wiring layer provided on the first semiconductor substrate, forming a second layer including a second semiconductor substrate on which a plurality of transistors configured to implement a global shutter operation are provided, and a second wiring layer stacked on the second semiconductor substrate, forming a first bonding metal exposed on a surface of the first wiring layer and a second bonding metal exposed on a surface of the second wiring layer, forming a first bonding structure by bonding the first bonding metal to the second bonding metal, forming a bonding via in contact with a wiring included in the second wiring layer and penetrating the second semiconductor substrate, forming a third layer including a third semiconductor substrate on which a logic circuit is provided and a third wiring layer provided on the third semiconductor substrate, forming a third bonding metal exposed on a surface of the third wiring layer, and forming a second bonding structure by bonding the bonding via to the third bonding metal.

BRIEF DESCRIPTION OF DRAWINGS

The above and other aspects, features, and advantages of example embodiments will be more clearly understood from the following detailed description, taken in conjunction with the accompanying drawings, in which.

DETAILED DESCRIPTION

Hereinafter, example embodiments will be described as follows with reference to the accompanying drawings.

Figure 1:
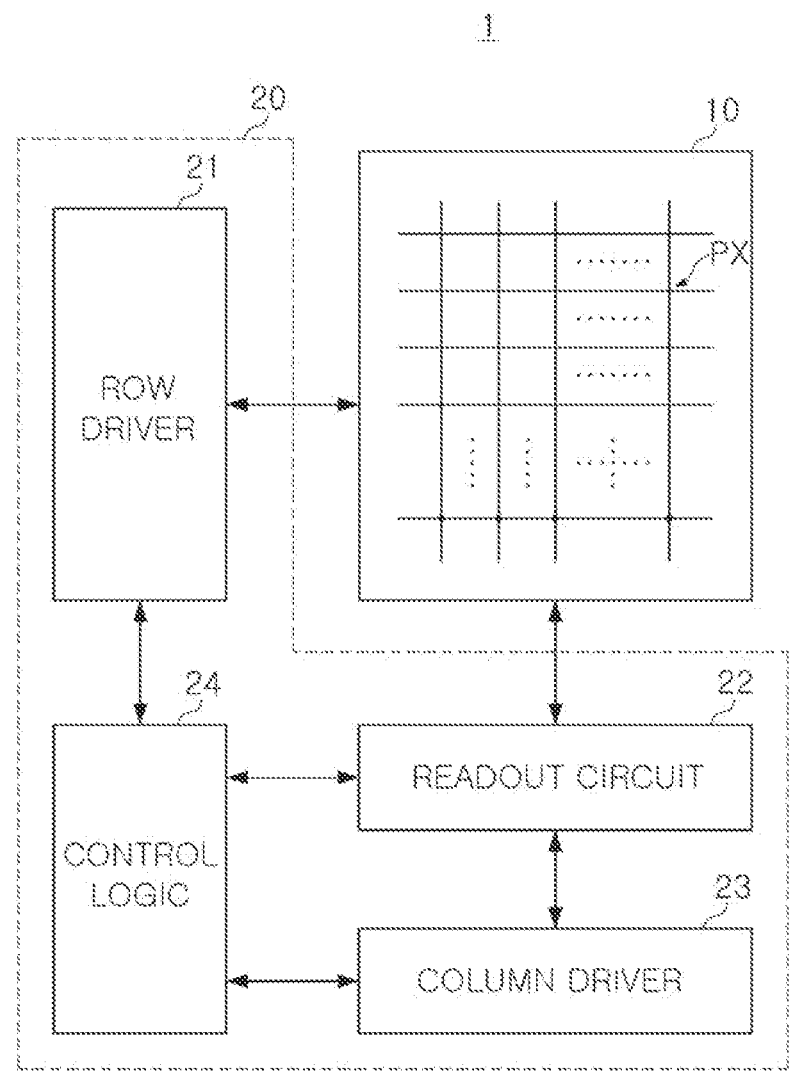
FIG. 1 is a block diagram illustrating an image sensor according to an example embodiment.

FIG. 1 is a block diagram illustrating an image sensor according to an example embodiment.

Referring to FIG. 1, an image sensor 1 in an example embodiment may include a pixel array 10 and a logic circuit 20.

The pixel array 10 may include a plurality of unit pixels PX arranged in an array form along a plurality of rows and a plurality of columns. Each of the unit pixels PX may include at least one photoelectric conversion device generating charges in response to light, and a pixel circuit generating a pixel signal corresponding to electric charges generated by the photoelectric conversion device.

The photoelectric conversion device may include a photodiode formed of a semiconductor material, and/or an organic photodiode formed of an organic material. In an example embodiment, each of the unit pixels PX may include two or more photoelectric conversion devices, and the two or more photoelectric conversion devices included in a single unit pixel PX may generate electric charges by receiving light of different colors. In an example embodiment, each of the plurality of unit pixels PX may include a photodiode for generating electric charges by receiving light. However, an example embodiment thereof is not limited thereto.

In example embodiments, the pixel circuit may include a transfer transistor, a driver transistor, a select transistor, and a reset transistor. When each of the unit pixels PX includes a single photoelectric conversion device, each of the unit pixels PX may include a pixel circuit for processing electric charges generated by the photoelectric conversion device. For example, each of the plurality of unit pixels PX included in the image sensor 1 in an example embodiment may include a photodiode. Accordingly, a pixel circuit corresponding to each of the unit pixels PX may include a transfer transistor, a driver transistor, a select transistor, and a reset transistor.

However, an example embodiment thereof is not limited thereto. For example, the plurality of unit pixels PX included in the image sensor 1 in an example embodiment may share a floating diffusion region by a predetermined unit, and accordingly, at least some of the photoelectric conversion devices may share at least one of a driver transistor, a select transistor, and a reset transistor.

The logic circuit 20 may include circuits for controlling the pixel array 10. For example, the logic circuit 20 may include a row driver 21, a readout circuit 22, a column driver 23, and a control logic 24.

The row driver 21 may drive the pixel array 10 in a row unit. For example, the row driver 21 may generate a transfer control signal for controlling a transfer transistor of the pixel circuit, a reset control signal for controlling the reset transistor, and a select control signal for controlling the select transistor, and may generate the signals to the pixel array 10 in a row unit.

The readout circuit 22 may include a correlated double sampler (CDS), an analog-to-digital converter, and the like. The correlated double samplers may be connected to the unit pixels PX through column lines. The correlated double samplers may perform correlated double sampling by receiving a pixel signal from unit pixels PX connected to a row line selected by a row line selection signal of the row driver 21. The pixel signal may be received via the column lines. The analog-to-digital converter may convert the pixel signal detected by the correlated double sampler into a digital pixel signal and may transfer the signal to the column driver 23.

The column driver 23 may include a latch or buffer circuit and an amplifier circuit for temporarily storing a digital pixel signal, and may process a digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

Among the unit pixels PX, the unit pixels PX arranged in the same position in the horizontal direction may share the same column line. For example, unit pixels PX disposed in the same position in the vertical direction may be simultaneously selected by the row driver 21 and may output pixel signals through column lines. In an example embodiment, the readout circuit 22 may simultaneously acquire pixel signals from the unit pixels PX selected by the row driver 21 through column lines. The pixel signal may include a reset voltage and a pixel voltage, and the pixel voltage may be obtained by reflecting electric charges generated by each of the unit pixels PX in response to light to the reset voltage. However, the description described with reference to FIG. 1 may not be limited thereto, and the image sensor may further include other components and may be driven in various ways.

Figure 2:
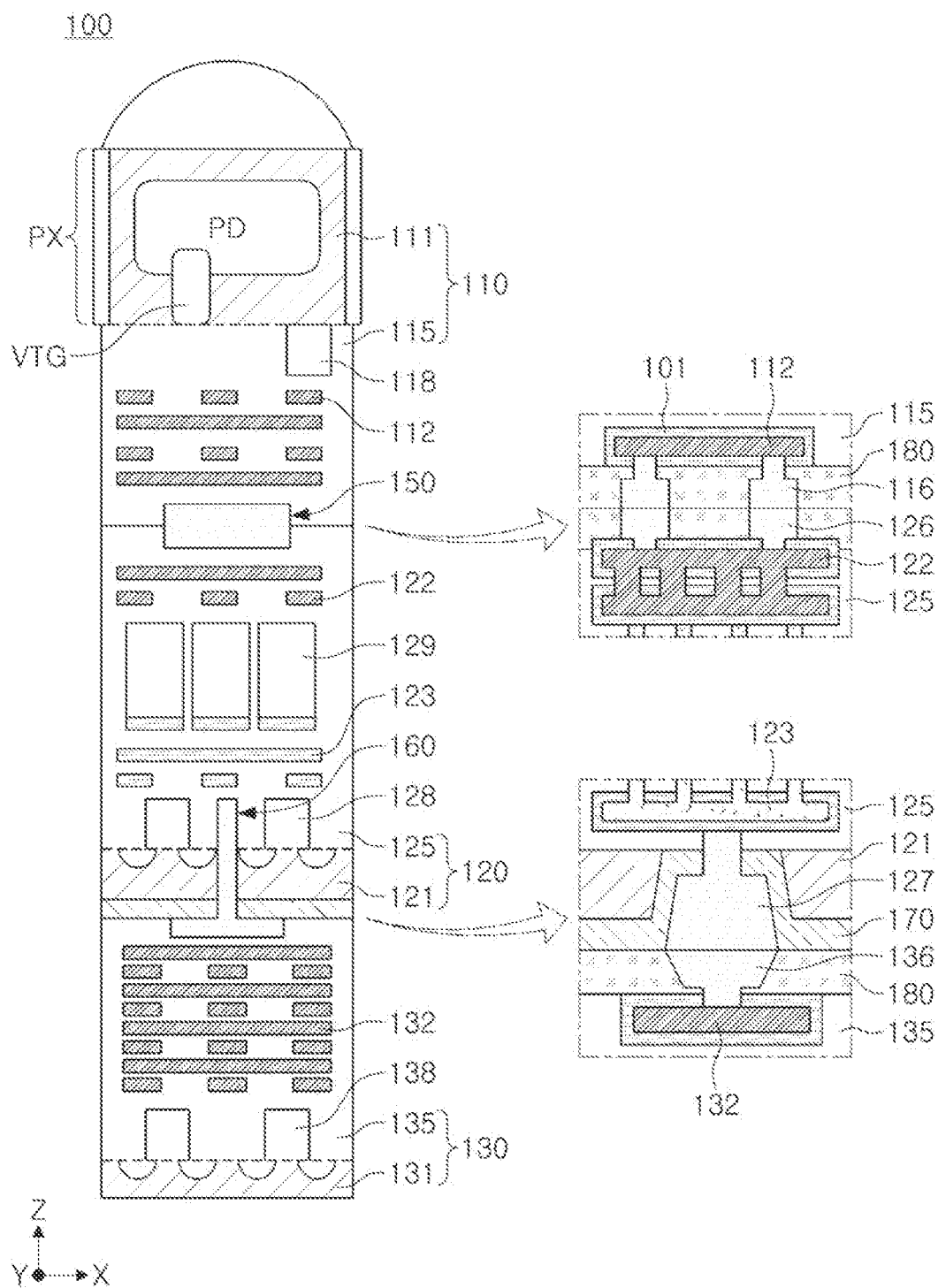
FIG. 2 is a diagram illustrating an image sensor according to an example embodiment.

FIG. 2 is a diagram illustrating an image sensor according to an example embodiment.

Referring to FIG. 2, the image sensor 100 in an example embodiment may include a first layer 110, a second layer 120, and a third layer 130. The first layer 110 may be connected to the second layer 120 by a first bonding structure 150, and the second layer 120 may be connected to the third layer 130 by a second bonding structure 160.

A single first bonding structure 150 and a single second bonding structure 160 are illustrated in FIG. 2, but an example embodiment thereof is not limited thereto, and a plurality of the first bonding structures 150 and a plurality of the second bonding structures 160 may be provided.

The first layer 110 may include a first semiconductor substrate 111 including a pixel unit PX in which a plurality of unit pixels are arranged, and a first wiring layer 115 stacked on the first semiconductor substrate 111.

The pixel unit PX may include a photodiode PD for converting incident light into an electrical signal and a gate VTG of a transfer transistor included in the pixel circuit. For example, a gate of the transfer transistor may have a vertical structure in which at least a partial region is embedded in the first semiconductor substrate 111. However, embodiments are not limited thereto.

The first wiring layer 115 may include a transistor 118 formed in a region adjacent to the first semiconductor substrate 111. For example, the transistor 118 formed in the first wiring layer 115 may be configured as a transfer transistor. The first wiring layer 115 may include a plurality of first wirings 112. However, the structure of the first wiring layer 115 illustrated in FIG. 2 is merely an example and embodiments not limited thereto.

The second layer 120 may include a second semiconductor substrate 121 on which a predetermined circuit is formed, and a second wiring layer 125 stacked on the second semiconductor substrate 121. For example, a circuit formed on the second semiconductor substrate 121 may be configured as a circuit including a plurality of transistors 128 for implementing a global shutter operation.

The plurality of transistors 128 formed on the second semiconductor substrate 121 may implement a global shutter operation along with the plurality of capacitors 129 included in the second wiring layer 125. For example, the plurality of transistors 128 and the plurality of capacitors 129 may operate to simultaneously expose overall pixels on the image sensor 100 to light and to perform a readout operation in a row unit. The second wiring layer 125 may include a plurality of second wirings 122 and 123.

The second layer 120 may be connected to the first layer 110 by the first bonding structure 150, and the first wiring layer 115 and the second wiring layer 125 may oppose each other in a first direction (e.g., the Z direction) perpendicular to the upper surface of the second layer 120.

The third layer 130 may include a third semiconductor substrate 131 on which a predetermined circuit is formed, and a third wiring layer 135 stacked on the third semiconductor substrate 131. For example, the predetermined circuit formed on the third semiconductor substrate 131 may be configured as a logic circuit of the image sensor 100. the logic circuit formed on the third semiconductor substrate 131 may include a plurality of transistors 138, and the plurality of transistors 138 may implement the logic circuit 20 of the image sensor 1 illustrated in FIG. 1. The third wiring layer 135 may include a plurality of third wirings 132.

The third layer 130 may be connected to the second layer 120 by the second bonding structure 160, and the second semiconductor substrate 121 and the third wiring layer 135 may oppose each other in the first direction.

Referring to the first bonding structure 150 and the second bonding structure 160 illustrated in FIG. 2, each of the first wiring layer 115, the second wiring layer 125, and the third wiring layer 135 may include a bonding metal extending in a second direction (e.g., the X direction) perpendicular to the first direction and exposed to one surface of each of the first, second, and third wiring layers 115, 125, and 135. For example, the first bonding metal 116 may be exposed on one surface of the first wiring layer 115, the second bonding metal 126 may be exposed on one surface of the second wiring layer 125, and the third bonding metal 136 may be exposed on one surface of the third wiring layer 135.

Each of the first bonding metal 116, the second bonding metal 126, and the third bonding metal 136 may be connected to a portion of a plurality of first, second, and third wirings 112, 122, and 132 disposed in the first, second, and third wiring layers 115, 125, and 135. For example, the first bonding metal 116 may be connected to a lowermost wiring of the first wiring 112 included in the first wiring layer 115, the second bonding metal 126 may be connected to an uppermost wiring of the second upper wiring 122 included in the second bonding metal 126, and the third bonding metal 136 may be connected to an uppermost wiring of the third wiring 132 included in the third wiring layer 135.

The plurality of first, second, and third wirings 112, 122, and 132 may be formed of copper (Cu), and a barrier metal 101 may be formed between the plurality of first, second, and third wirings 112, 122, and 132 and the first, second, and third wiring layers 115, 125, and 135. However, embodiments are not limited thereto.

In the image sensor 100 in an example embodiment, each of the first bonding metal 116, the second bonding metal 126, and the third bonding metal 136 may be formed by a process separate from a process of forming the first wiring layer 115, the second wiring layer 125, and the third wiring layer 135. Accordingly, each of the regions 180 surrounding the first bonding metal 116, the second bonding metal 126, and the third bonding metal 136 may be formed by a process separate from a process of forming the first, second, and third wiring layers 115, 125, and 135. However, embodiments are not limited thereto.

In the image sensor 100 in an example embodiment, the plurality of first bonding structures 150 may bond the first layer 110 to the second layer 120 by allowing the first bonding metal 116 to be in contact with the second bonding metal 126. In this case, the first bonding metal 116 and the second bonding metal 126 may be formed of Cu. For example, the plurality of first bonding structures 150 may be bonding structures formed by Cu—Cu bonding.

The second bonding structure 160 may bond the second layer 120 to the third layer 130 by allowing the bonding via 127 penetrating the second semiconductor substrate 121 to be in contact with the third bonding metal 136. In this case, the bonding via 127 and the third bonding metal 136 may be formed of Cu. For example, the plurality of second bonding structures 160 may also be bonding structures formed by Cu—Cu bonding, and the bonding vias 127 and the third bonding metal 136 may be disposed to overlap each other in the first direction.

The bonding via 127 may be separated from the second semiconductor substrate 121 by the spacer layer 170. The bonding via 127 may penetrate the second semiconductor substrate 121 and may be connected to the second lower wiring 123 included in the second wiring layer 125. For example, the second lower wiring 123 may be wirings formed before the plurality of capacitors 129.

A process of manufacturing the plurality of capacitors 129 may include a process of forming a dielectric film. The process of forming a dielectric film to improve leakage properties of the plurality of capacitors 129 may be performed at a relatively high temperature. When the dielectric layer is formed at a high temperature, the second lower wiring 123 formed before the capacitors may be formed of tungsten (W).

Accordingly, the second lower wiring 123 may be formed of a material different from that of the first wiring 112, the second upper wiring 122, and the third wiring 132. However, embodiments are not limited thereto. For example, the second lower wiring 123 may be formed of copper (Cu). Tungsten may have relatively high resistivity and low reflectance as compared to other metals, such as, for example, copper (Cu). Accordingly, when the second lower wiring 123 is formed of tungsten, properties of the image sensor 100 may be deteriorated, as compared to when the second lower wiring 123 is formed of copper.

Figure 3:
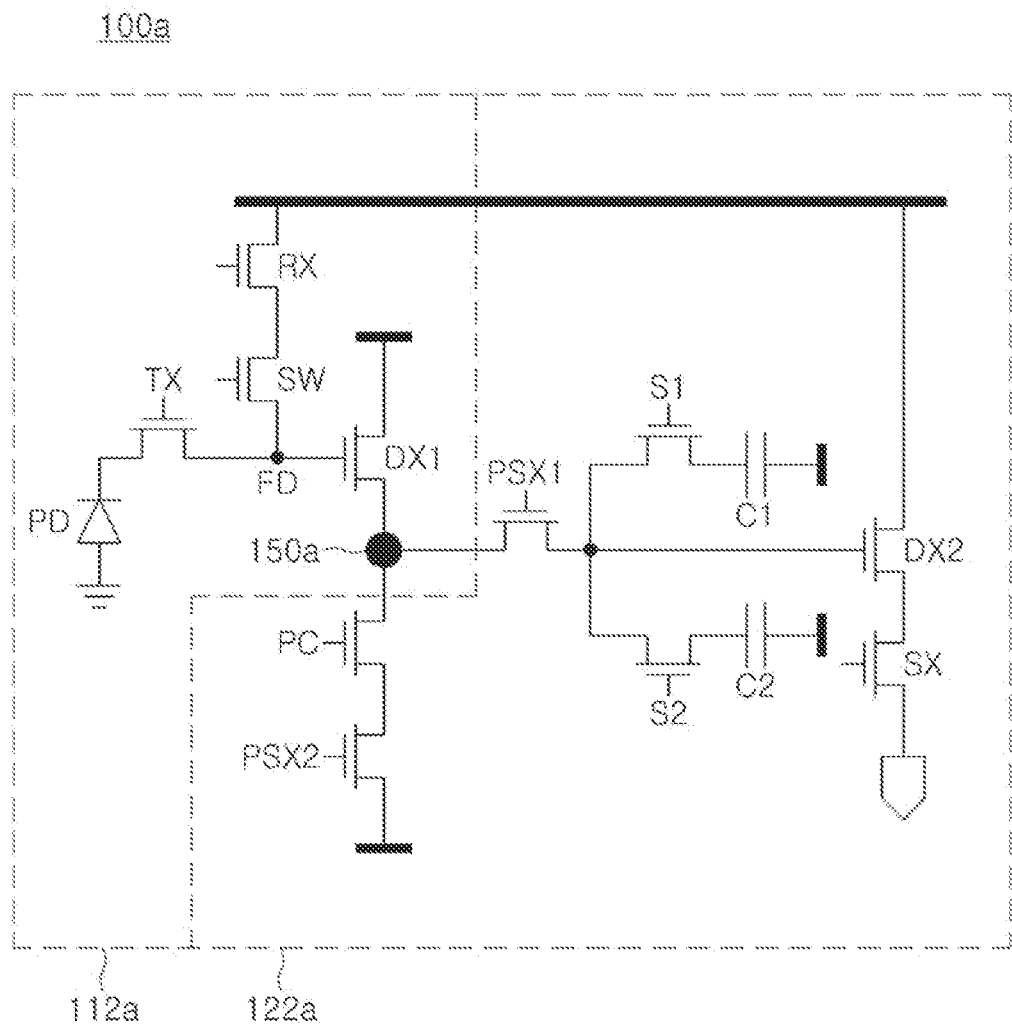
FIGS. 3 and 4 are circuit diagrams illustrating a circuit included in an image sensor according to an example embodiment.
Figure 4:
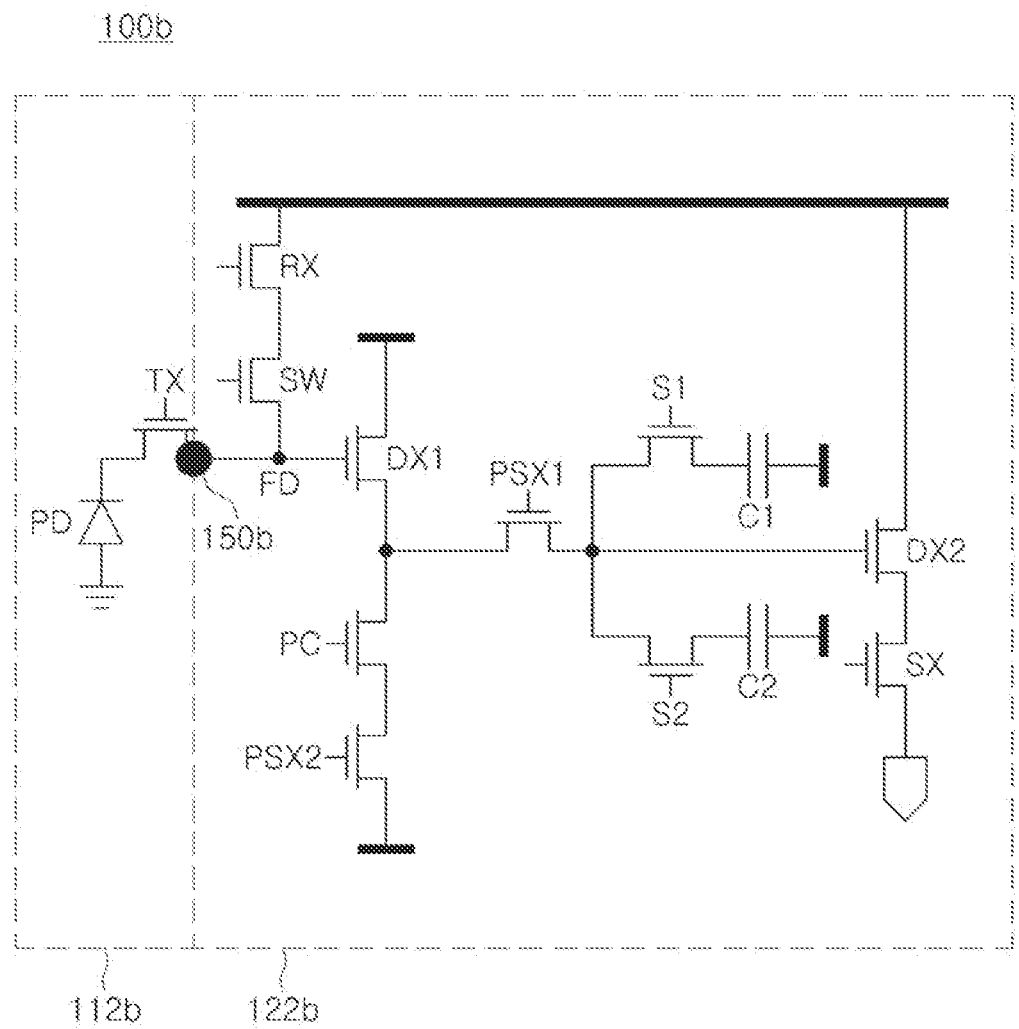

FIGS. 3 and 4 are circuit diagrams illustrating a circuit included in an image sensor according to an example embodiment.

Each of the circuits 100a and 100b illustrated in FIGS. 3 and 4 may include a circuit formed on the first layer 110 and the second layer 120 included in the image sensor 100 illustrated in FIG. 2 and a first bonding structure 150.

The circuit formed in the first layer 110 and the second layer 120 of the image sensor 100 may include a plurality of semiconductor devices for processing electric charges generated by the photodiode PD together with the photodiode PD. For example, in the first layer 110 and the second layer 120, a pixel circuit for converting light into an electrical signal using a photodiode PD, and a global shutter circuit for operating the pixel circuit by a global shutter method.

In the image sensor 100 in an example embodiment, transistors included in each of the circuits 100a and 100b may be formed on the semiconductor substrates 111 and 121, and wirings included in each of the each of the circuits 100a and 100b may be formed in the wiring layers 115 and 125 and may correspond to the first wiring 112 and the second wiring 122 and 123.

Referring to FIGS. 3 and 4, each of the circuits 100a and 100b may include a photodiode PD, a transfer transistor TX, a reset transistor RX, drive transistors DX1 and DX2, and a select transistor SX. A floating diffusion region FD may be formed between an electrode of the transfer transistor TX and a gate electrode of the first drive transistor DX1, and a switch device SW for dynamically adjusting a gain of a pixel circuit may be connected between the floating diffusion region FD and the reset transistor RX. The gate electrodes of the transistors included in the circuits 100a and 100b may be connected to a driving signal line.

The photodiode PD may generate electric charges in proportion to the amount of light incident from the outside and may accumulate electric charges in the photodiode PD. The transfer transistor TX may be connected to the photodiode PD and may transfer electric charges accumulated in the photodiode PD to the floating diffusion region FD.

The reset transistor RX may periodically reset electric charges accumulated in the floating diffusion region FD. For example, when the switch device SW is turned on and the reset transistor RX is turned on, electric charges accumulated in the floating diffusion region FD may be discharged by a potential difference from a power voltage and the floating diffusion region FD may be reset, and a voltage of the floating diffusion region FD may be equalized to the power voltage.

An operation of the drive transistors DX1 and DX2 may be controlled according to the amount of electric charges accumulated in a region connected to the gate electrode of the drive transistors DX1 and DX2. The drive transistors DX1 and DX2 may work as a source-follower buffer amplifier by being combined with a current source disposed externally of the pixel. For example, the first drive transistor DX1 may amplify a potential change caused by the accumulation of charges in the floating diffusion region FD and may output the amplified change.

The select transistor SX may select a pixel to be read in row units. When the select transistor SX is turned on, an electrical signal output by the second drive transistor DX2 may be transmitted to the select transistor SX.

The global shutter circuit included in each of the circuits 100a and 100b may include a plurality of transistors and a plurality of capacitors for operating the pixel circuit by a global shutter method. As an example, the global shutter circuit may store an electrical signal as a voltage domain and may efficiently perform correlated double sampling (CDS).

Referring to FIG. 3, in the circuit 100a included in the image sensor 100 in an example embodiment, the first bonding structure 150a may be formed in a boundary between a first region 112a including a pixel circuit and a second region 122a including the global shutter circuit. For example, the first region 112a may be a region included in the first layer 110, and the second region 112b may be a region included in the second layer 120. For example, the transistors included in the first region 112a may be formed on the first semiconductor substrate 111, and the transistors included in the second region 112b may be formed on the second semiconductor substrate 121.

In the image sensor 100 in an example embodiment, a transfer transistor TX, a reset transistor RX, and a first drive transistor DX1 may be formed on the first semiconductor substrate 111. The switch device SW may be further formed on the first semiconductor substrate 111. A second drive transistor DX2 and a select transistor SX may be formed on the second semiconductor substrate 121 together with the plurality of transistors PC, PSX1, PSX2, S1, and S2 included in the global shutter circuit.

Referring to FIG. 4, in the circuit 100b included in the image sensor 100 in an example embodiment, the first bonding structure 150b may be formed in the floating diffusion region FD. Accordingly, the transfer transistor TX may be included in the first region 112b included in the first layer 110, and the pixel circuit and the global shutter circuit other than the transfer transistor TX may be included in the second region 122b included in the second layer 120. For example, the transfer transistor TX may be formed on the first semiconductor substrate 111, and transistors other than the transfer transistor TX may be formed on the second semiconductor substrate 121.

Figure 5:
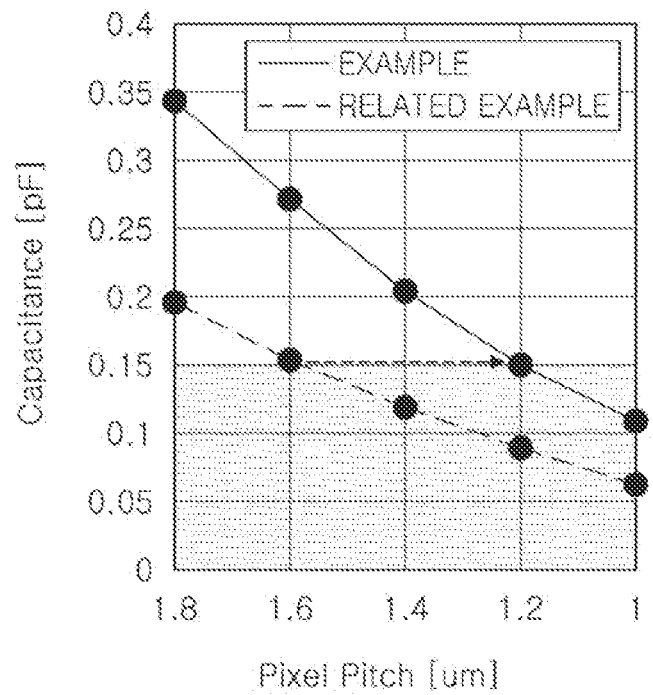
FIGS. 5 and 6 are diagrams illustrating an effect of an image sensor according to an example embodiment.
Figure 6:
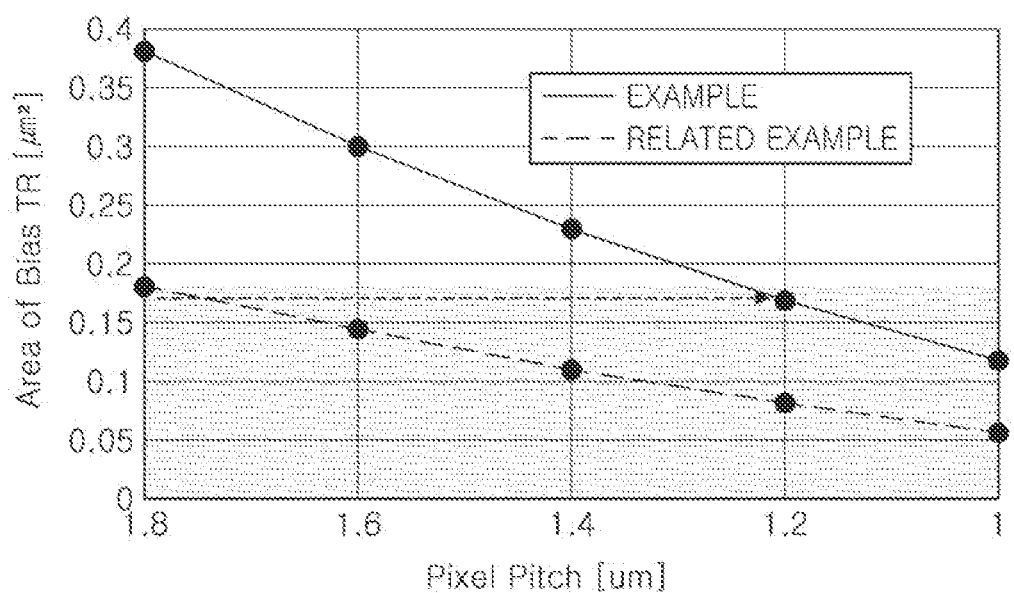

FIGS. 5 and 6 are diagrams illustrating an effect of an image sensor according to an example embodiment.

Referring to FIGS. 3 and 4 together, an image sensor 100 in an example embodiment may include eleven transistors per pixel to implement a pixel circuit and a global shutter circuit. For example, the eleven transistors may be dispersedly disposed on the first semiconductor substrate 111 and the second semiconductor substrate 121, thereby improving scaling efficiency.

Referring to FIG. 5, the image sensor 100, according to an example embodiment, in which the pixel circuit and the global shutter circuit are dispersedly arranged may secure higher capacitance when compared to the image sensor of a related example in which the circuits are not dispersedly arranged.

Capacitance of a pixel may be directly related to random telegraph signal (RTS) noise. For example, to maintain the RTS noise to be 10 ppm or less, the image sensor may need to secure capacitance of about 0.15 pF or more per pixel. The image sensor 100, according to an example embodiment, may secure capacitance necessary to maintain the RTS noise to be 10 ppm or less while reducing a pixel size when compared to a related example. However, the graph illustrated in FIG. 5 is merely an example and embodiments are not limited thereto, and a pixel pitch necessary to secure predetermined capacitance may be varied in example embodiments.

Referring to FIG. 6, the image sensor 100, according to an example embodiment, in which the pixel circuit and the global shutter circuit are dispersedly arranged may secure a greater area per transistor when compared to the image sensor of a related example in which circuits are not dispersedly arranged.

An area in which the transistors included in a pixel are disposed may be directly related to random telegraph signal (RTS) noise. For example, to maintain the RTS noise to be 10 ppm or less, the image sensor may need to secure an area of about 0.175 $\mu m^2$ or more per transistor. The image sensor 100, according to an example embodiment, may secure a transistor area necessary to maintain the RTS noise to be 10 ppm or less while reducing the pixel size when compared to a related example. However, the graph illustrated in FIG. 6 is merely an example and embodiments not limited thereto, and a pixel pitch necessary to secure a predetermined transistor area may be varied according to an example embodiment.

Figure 7:
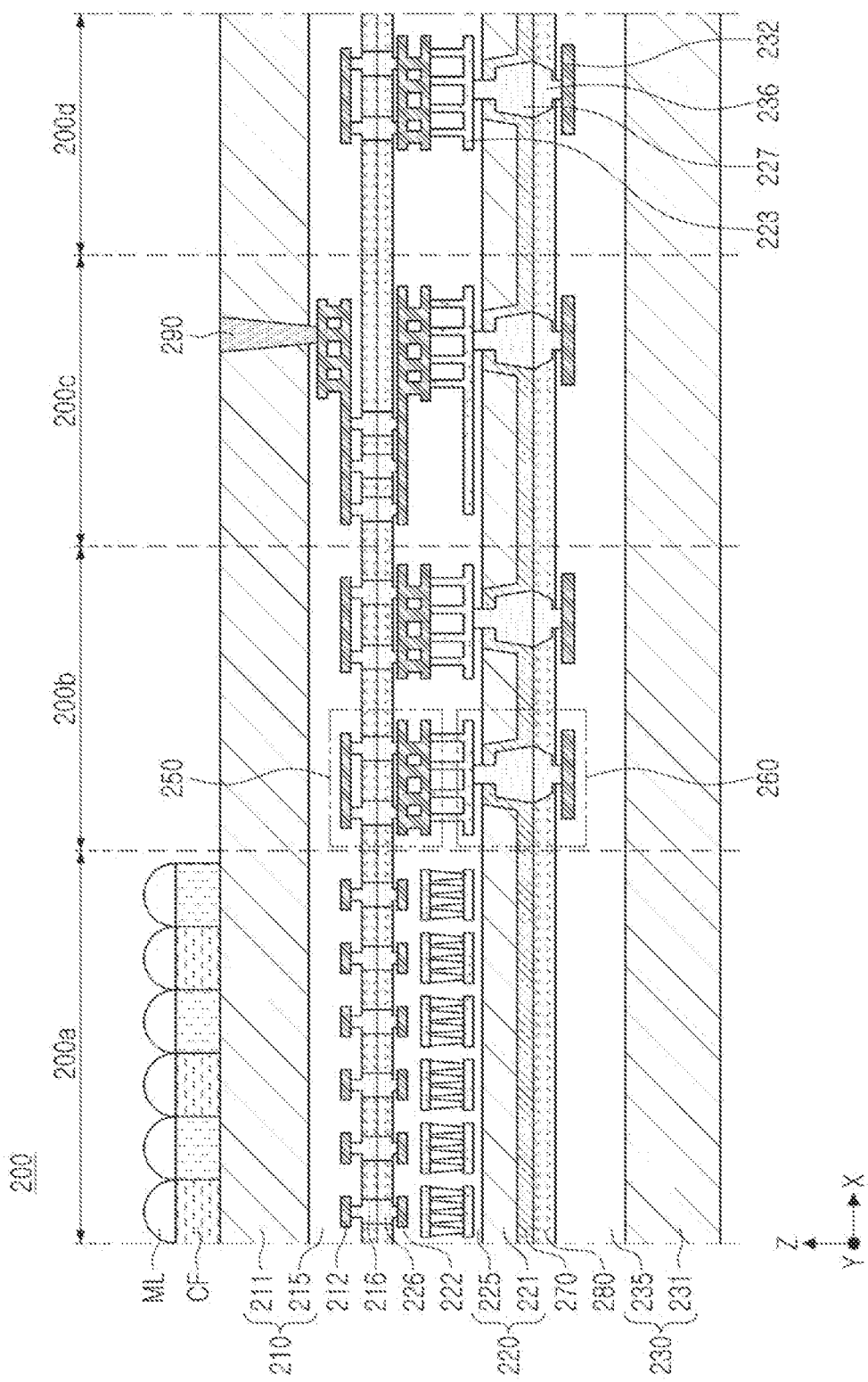
FIG. 7 is a plan diagram illustrating an image sensor according to an example embodiment.

FIG. 7 is a plan diagram illustrating an image sensor according to an example embodiment.

Referring to FIG. 7, an image sensor 200 in an example embodiment may include a first layer 210, a second layer 220, and a third layer 230 bonded to each other in order in the first direction (e.g., the Z direction). The first layer 210 may include a first semiconductor substrate 211 and a first wiring layer 215 stacked on the first semiconductor substrate 211, the second layer 220 may include a second semiconductor substrate 221 and a second wiring layer 225 stacked on the second semiconductor substrate 221, and the third layer 230 may include a third semiconductor substrate 231 and a third wiring layer 235 stacked on the third semiconductor substrate 231.

The image sensor 200 may be divided into a plurality of regions depending on a structure and a role thereof in a second direction (e.g., the X direction) and a third direction (e.g., the Y direction) perpendicular to the first direction. For example, the plurality of regions may include a first region 200a, a second region 200b, a third region 200c, and a fourth region 200d. However, FIG. 7 illustrates the example in which the plurality of regions are arranged side by side in the second direction, but embodiments are not limited thereto. The structure of each of the plurality of regions is merely an example and embodiments are not limited thereto.

The first region 200a may include a pixel unit and may connect regions in which a circuit for driving the pixel unit is formed to each other. For example, the pixel unit may be formed on the first semiconductor substrate 211, and may include components for light to be incident to the photodiode PD, such as a microlens ML and a color filter CF. Semiconductor devices for driving the pixel unit may be formed on the second semiconductor substrate 221.

Referring to FIGS. 3 and 4, at least the transfer transistor TX of the image sensor 200 may be formed on the first semiconductor substrate 211. Accordingly, the first layer 210 including the first semiconductor substrate 211 may be bonded to the second layer 220 including the second semiconductor substrate 221 by the first bonding structure 250.

The first bonding structure 250 may correspond to the first bonding structure 150 of the image sensor 100 illustrated in FIG. 2. For example, the first bonding structure 250 may be exposed on one surface of each of the first wiring layer 215 and the second wiring layer 225, and may include a first bonding metal 216 and a second bonding metal 226 connected to the first wiring 212 included in the first wiring layer 215 and a second upper wiring 222 included in the second wiring layer 225, respectively.

The second region 200b may not include a pixel unit, and may connect the first layer 210, the second layer 220, and the third layer 230 to each other. For example, the second region 200b may correspond to an example in which the pixel unit is not provided in the image sensor 100 illustrated in FIG. 2.

In the image sensor 200 in an example embodiment, the first bonding structure 250 and the second bonding structure 260 may correspond to the first bonding structure 150 and the second bonding structure 160 illustrated in FIG. 2. For example, the second bonding structure 260 may include a third bonding metal 236 exposed on one surface of the third wiring layer 235 and connected to the third wiring 232 included in the third wiring layer 235, and a bonding via 227 penetrating the semiconductor substrate 221 and connected to the second lower wiring 223 included in the second wiring layer 225. The bonding via 227 may be separated from the second semiconductor substrate 221 by the spacer layer 270.

The third region 200c may be an input/output region including an input/output terminal for connecting the image sensor 200 to an external entity. For example, the third region 200c may include a first bonding structure 250 and a second bonding structure 260, and may include a through-silicon via 290 used as an input/output terminal.

The through-silicon via 290 may penetrate the first semiconductor substrate 211 and may be connected to the first wiring 212 included in the first wiring layer 215. For example, the through-silicon via 290 may be connected to an uppermost wiring of the first wiring 212. However, embodiments are not limited thereto, and the through-silicon via 290 may be disposed to penetrate the third semiconductor substrate 231 in example embodiments. Example embodiments related to the internal structure of the third region 200c will be described later.

The fourth region 200d may be configured as a barrier region included to prevent issues which may occur during the process of manufacturing the image sensor 200. For example, the fourth region 200d may include the first bonding structure 250 and the second bonding structure 260, and may have the same structure as that of the second region 200b. However, embodiments are not limited thereto. For example, the fourth region 200d may include the first bonding structure 250 and the second bonding structure 260, but the arrangement of the first bonding structure 250 and the second bonding structure 260 may be different from the arrangement of the bonding structure 250 and the second bonding structure 260 in the second region 200b. The fourth region 200d will be described in greater detail later.

Figure 8A:
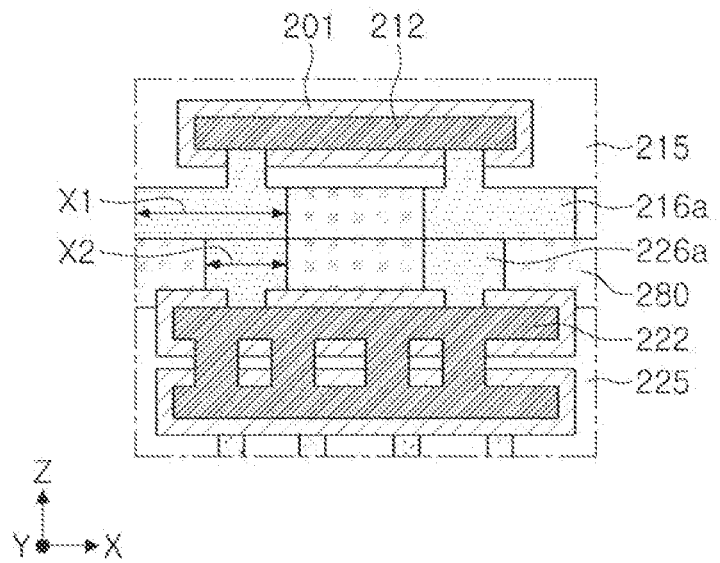
FIGS. 8A and 8B are diagrams illustrating a first bonding structure included in an image sensor according to an example embodiment.
Figure 8B:
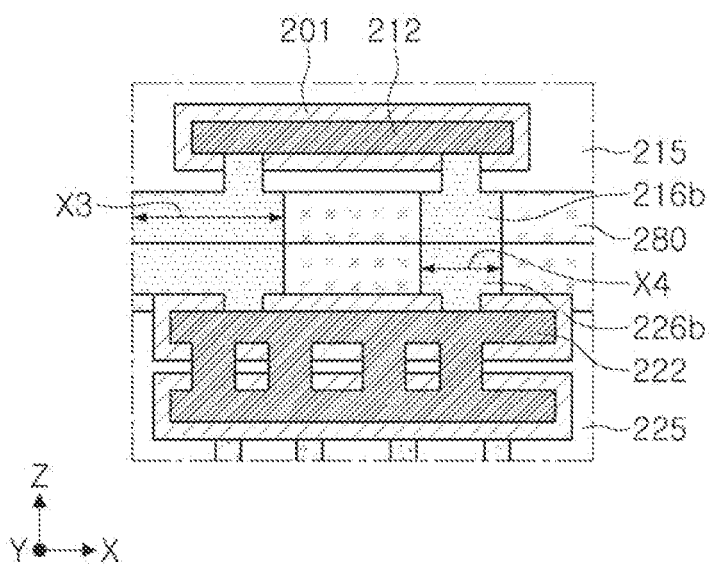

FIGS. 8A and 8B are diagrams illustrating a first bonding structure included in an image sensor according to an example embodiment.

Referring to FIG. 8A, a first bonding structure 250a may include a first bonding metal 216a connected to the first wiring 212 included in the first wiring layer 215, and a second bonding metal 226a connected to a second upper wiring 222 included in the second wiring layer 225.

The first bonding metal 216a and the second bonding metal 226a may be formed by a process separate from a process of forming the first wiring layer 215 and the second wiring layer 225. For example, the first wiring layer 215 and the second wiring layer 225 may be distinct from the region 280 provided adjacent to and surrounding the first bonding metal 216a and the second bonding metal 226a. However, embodiments are not limited thereto, and each of the first bonding metal 216a and the second bonding metal 226a may be defined as being exposed on one surface of the first wiring layer 215 and the second wiring layer 225.

The first wiring 212 and the second upper wiring 222 may have a shape surrounded by a barrier metal 201. For example, the barrier metal 201 may be a barrier separating the first and second wirings 212 and 222 from the first and second wiring layers 215 and 225. However, embodiments are not limited thereto. For example, the configurations of the first and second wirings 212 and 222 and the first and second wiring layers 215 and 225 may be varied in example embodiments, and accordingly, the barrier metal 201 may not be provided.

The first bonding metal 216a and the second bonding metal 226a may extend in the second direction (e.g., the X direction). For example, the extended length of the first bonding metal 216a may be X1, and the extended length of the second bonding metal 226a may be X2. X1 and X2 may be different values. The length X1 of the first bonding metal 216a illustrated in FIG. 8A may be greater than the length X2 of the second bonding metal 226a, but embodiments are not limited thereto. For example, in example embodiments, a value of X1 may be smaller than X2.

In the image sensor 200 in an example embodiment, the bonding metal having a relatively short length in the second direction may entirely overlap the bonding metal having a relatively long length in the first direction (e.g., the Z direction).

The image sensor 200 may include a plurality of first bonding structures 250a. Accordingly, the first bonding metal 216a and the second bonding metal 226a included in the plurality of first bonding structures 250a may be formed to have different shapes. For example, the extended lengths of the first bonding metal 216a and the second bonding metal 226a included in at least one of the plurality of first bonding structures 250a in the second direction may be the same.

Referring to FIG. 8B, the first bonding structure 250b may include a first bonding metal 216b connected to the first wiring 212 included in the first wiring layer 215, and a second bonding metal 226b connected to the second upper wiring 222 included in the second wiring layer 225.

The image sensor 200 may include a plurality of first bonding structures 250b. Accordingly, the first bonding metal 216b and the second bonding metal 226b included in the plurality of first bonding structures 250b may be configured to have different shapes. For example, the extended lengths of the first bonding metal 216b and the second bonding metal 226b included in at least one of the plurality of first bonding structures 250b in the second direction may be X3. The extended length of the first bonding metal 216b and the second bonding metal 226b included in at least the other of the plurality of first bonding structures 250b in the second direction may be X4. X3 and X4 may be different values.

The first bonding structures 250a and 250b illustrated in FIGS. 8A and 8B are merely examples and embodiments are not limited thereto. For example, the first bonding structures 250a and 250b included in the image sensor 200 may include various types of bonding structures having a Cu—Cu bonding structure.

Figure 9:
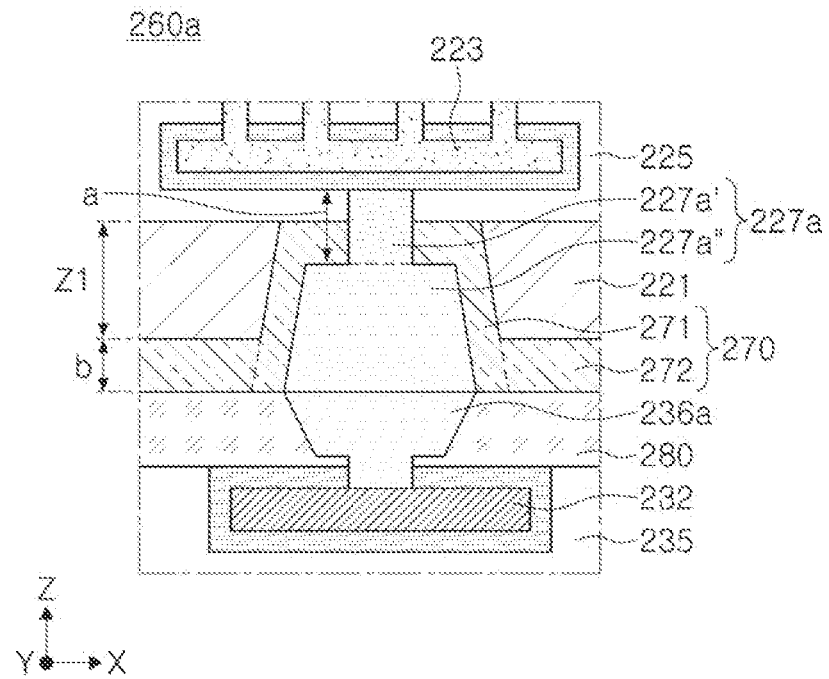
FIGS. 9 and 10 are diagrams illustrating a second bonding structure included in an image sensor according to an example embodiment.
Figure 10:
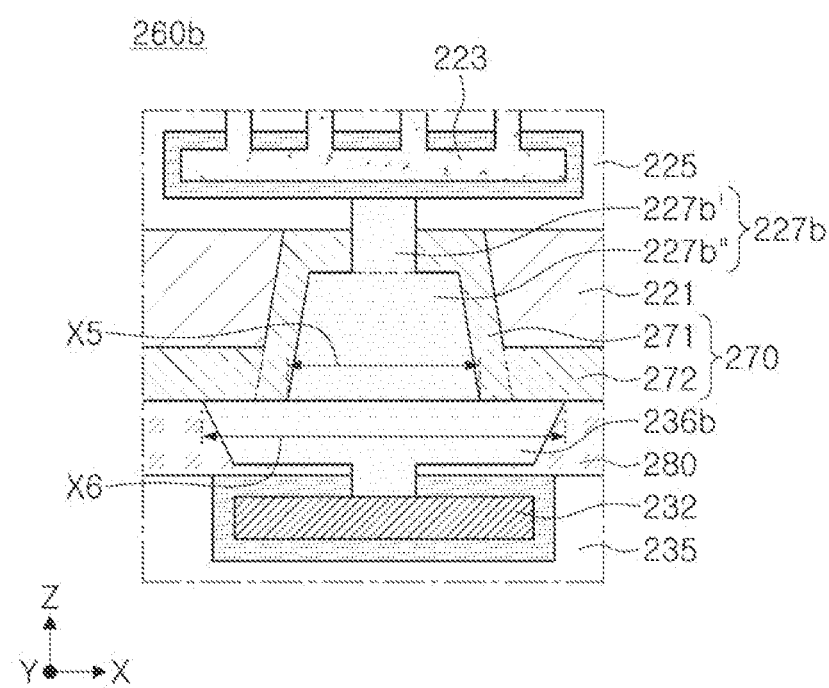

FIGS. 9 and 10 are diagrams illustrating a second bonding structure included in an image sensor according to an example embodiment.

Referring to FIG. 9, the second bonding structure 260a may include a third bonding metal 236a connected to the third wiring 232 included in the third wiring layer 235, and a bonding via 227a penetrating the second semiconductor substrate 221 and connected to the second lower wiring 223 included in the second wiring layer 225. For example, the second lower wiring 223 may include tungsten (W) and/or copper (Cu), and the second lower wiring 223 may have a configuration different from wirings included in the other wiring layers. However, embodiments are not limited thereto.

The third bonding metal 236a may be formed by a process separate from a process of forming the third wiring layer 235. For example, the third wiring layer 235 may be distinct from the region 280 surrounding the third bonding metal 236a. However, embodiments are not limited thereto, and the third bonding metal 236a may be defined as being exposed on one surface of the third wiring layer 235.

In the image sensor 200 in an example embodiment, to reduce the size of the image sensor and noise, after the first bonding structure is formed, a process of thinning the second semiconductor substrate 221 may be performed. For example, through the thinning process, the second semiconductor substrate 221 may be polished to have a predetermined thickness. Accordingly, the second semiconductor substrate 221 may have a width Z1 in the first direction. For example, Z1 may have a value between about 10 nm and 2 µm.

In the image sensor 200 in an example embodiment, the bonding via 227a may include an upper via region 227a' in contact with the second lower wiring 223 and having a first width in a second direction perpendicular to the first direction, and a lower via region 227a'' in contact with the third bonding metal 236a and having a second width greater than the first width in the second direction.

The bonding via 227a and the second semiconductor substrate 221 may be separated from each other by a spacer layer 270. The spacer layer 270 may include a first spacer layer 271 disposed between the second semiconductor substrate 221 and the bonding via 227a, and a second spacer layer 272 disposed between the second semiconductor substrate 221 and the third wiring layer 235.

In the image sensor 200 in an example embodiment, the first spacer layer 271 and the second spacer layer 272 may be formed of different materials. For example, the first spacer layer may be formed of a composite film including silicon carbon-nitride (SiCN), and the second spacer layer may be formed of a composite film including metal oxide. For example, the composite film included in the second spacer layer may include metal oxide such as hafnium oxide (HfOx), tantalum oxide (TaOx), or aluminum oxide (AlOx). However, embodiments are not limited thereto.

The upper via region 227a' may have a first thickness a in the first direction. As an example, the first thickness may be between about 100 nm and 800 nm. The second spacer layer 272 may have a second thickness b in the first direction. In the image sensor in an example embodiment, the first thickness a may be greater than the second thickness b.

Referring to FIG. 10, the configuration of the second bonding structure 260b may correspond to the configuration of the second bonding structure 260a illustrated in FIG. 9. For example, the second bonding structure 260b may bond a second layer including a second semiconductor substrate 221 and a second wiring layer 225 to a third layer including a third semiconductor substrate 231 and a third wiring layer 235. The second lower wiring 223, the bonding via 272b, the third bonding metal 236b, and the third wiring 232 may be connected to each other in order and may bond the second layer to the third layer. The bonding via 272b may include an upper via region 272b' and a lower via region 272b" and may be separated from the second semiconductor substrate 221 by the spacer layer 270 including the first spacer layer 271 and the second spacer layer 272.

The image sensor 200 may include a plurality of second bonding structures 260b, and the plurality of second bonding structures 260b included in the image sensor 200 may be formed in various structures in example embodiments.

In the image sensor 200 in an example embodiment, the extended length of the third bonding metal 236b included in at least one of the plurality of second bonding structures 260b in the second direction may be different from the extended length of the third bonding metal 236b included in the other of the plurality of second bonding structures 260b.

Accordingly, the extended length of the third bonding metal 236b in the second direction may be different from a width of the lower via region 227b". For example, the extended length of the third bonding metal 236b in the second direction may be X6, and the width of the lower via region 227b" may be X5. X5 may be smaller than X6 in FIG. 10, but embodiments are not limited thereto.

Figure 11A:
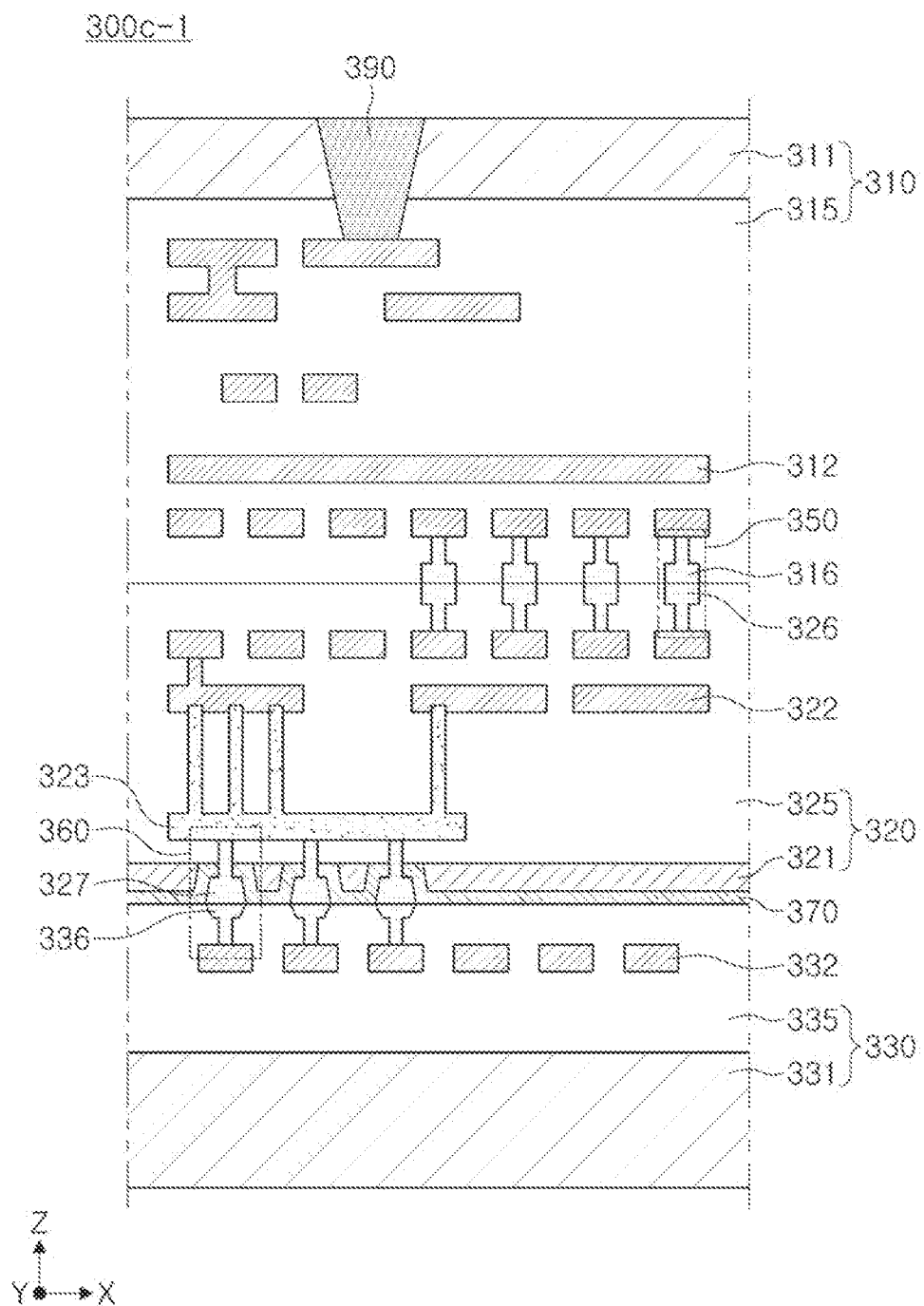
FIGS. 11A, 11B, and 11C are plan diagrams illustrating a structure of an input/output region included in an image sensor according to an example embodiment.
Figure 11B:
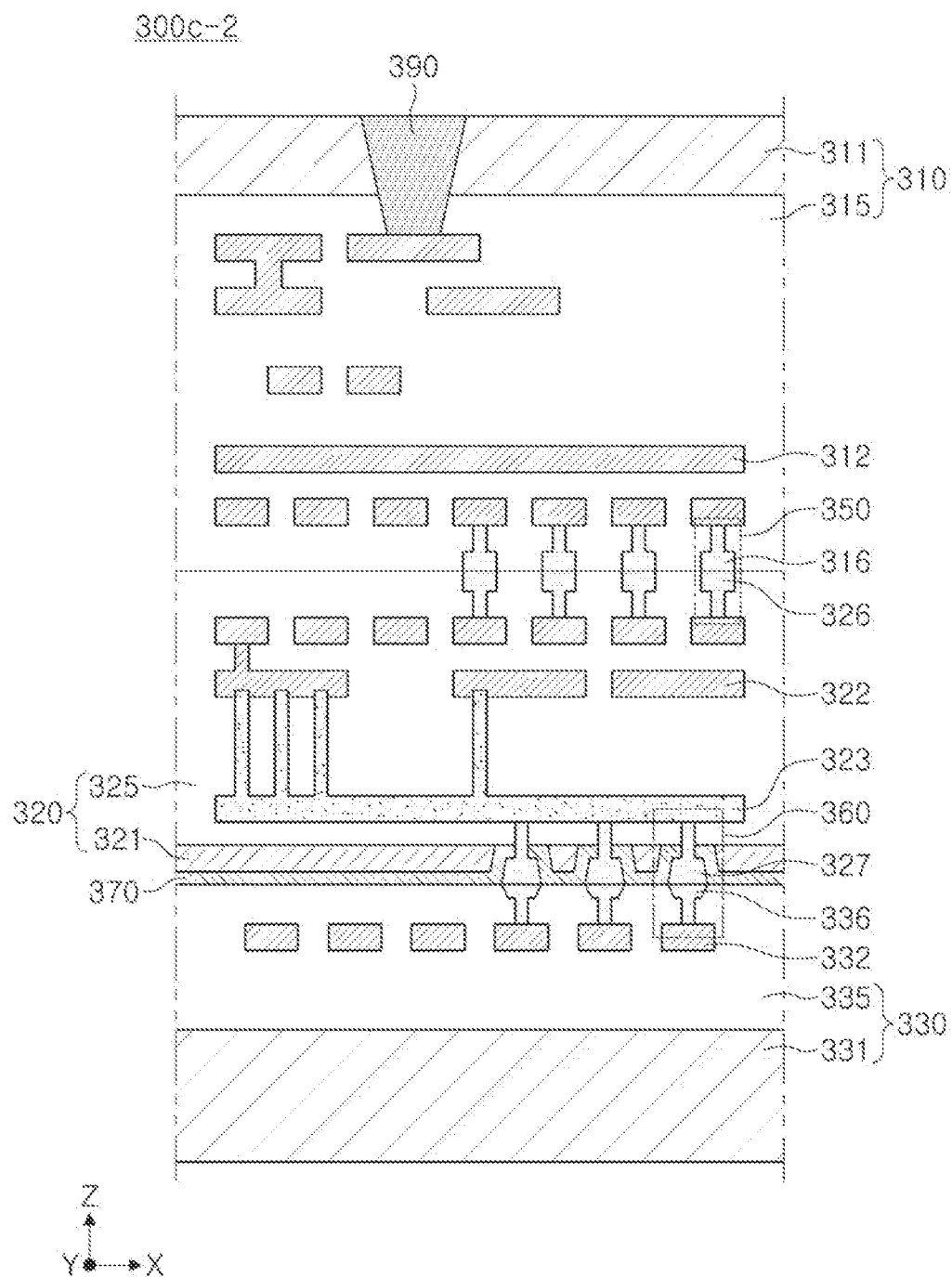
Figure 11C:
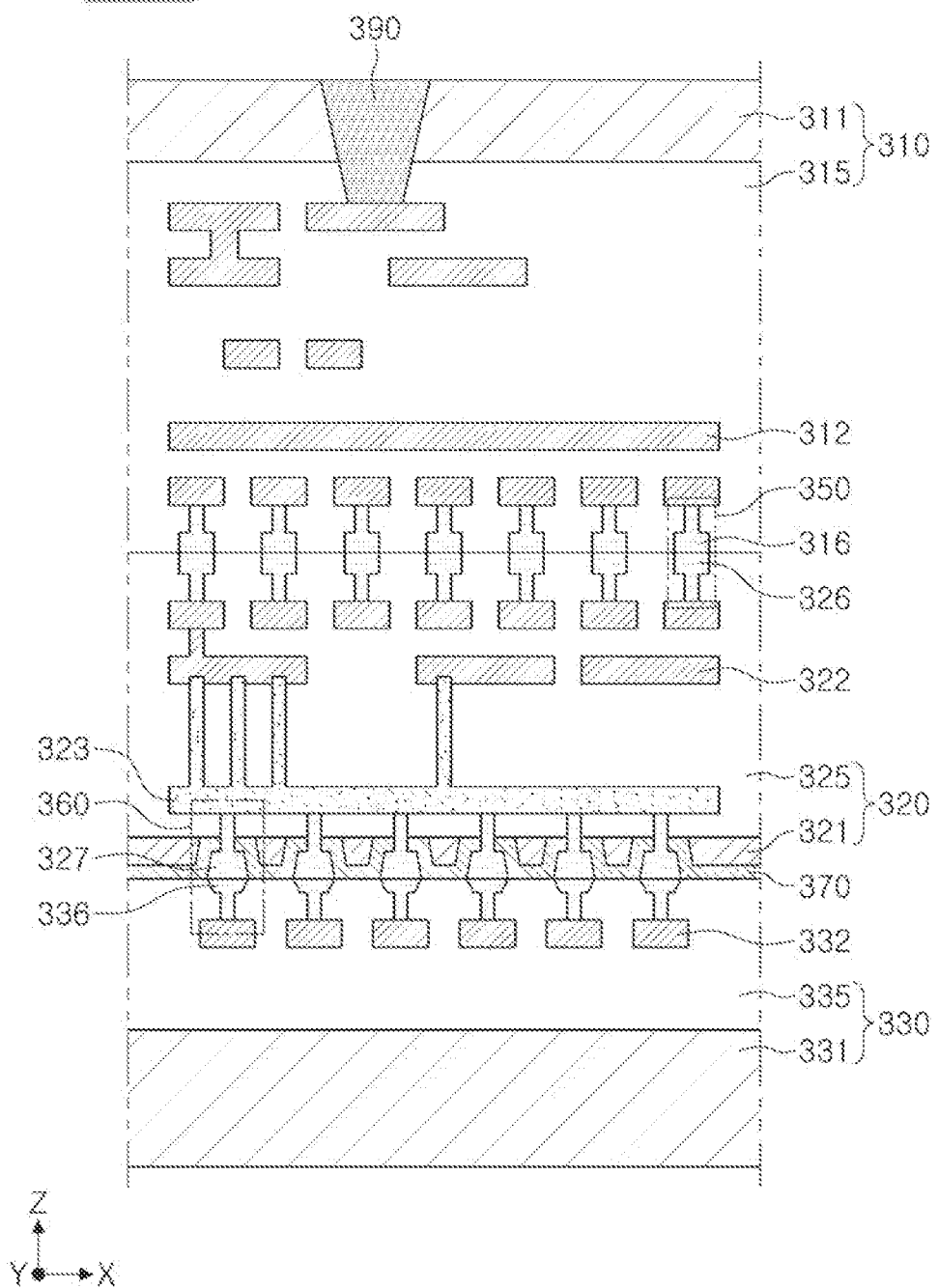
Figure 12A:
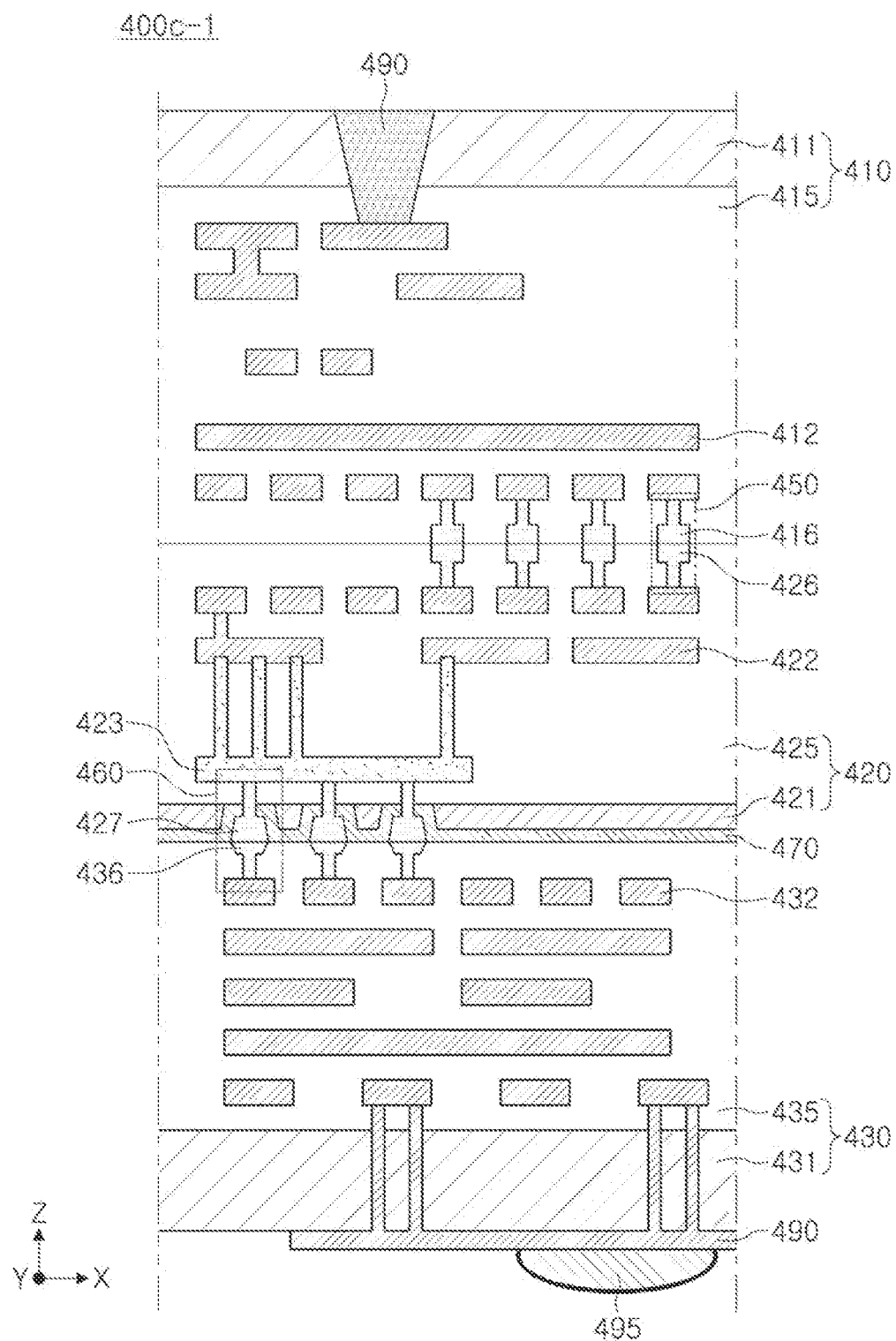
FIGS. 12A, 12B, and 12C are plan diagrams illustrating a structure of an input/output region included in an image sensor according to an example embodiment.
Figure 12B:
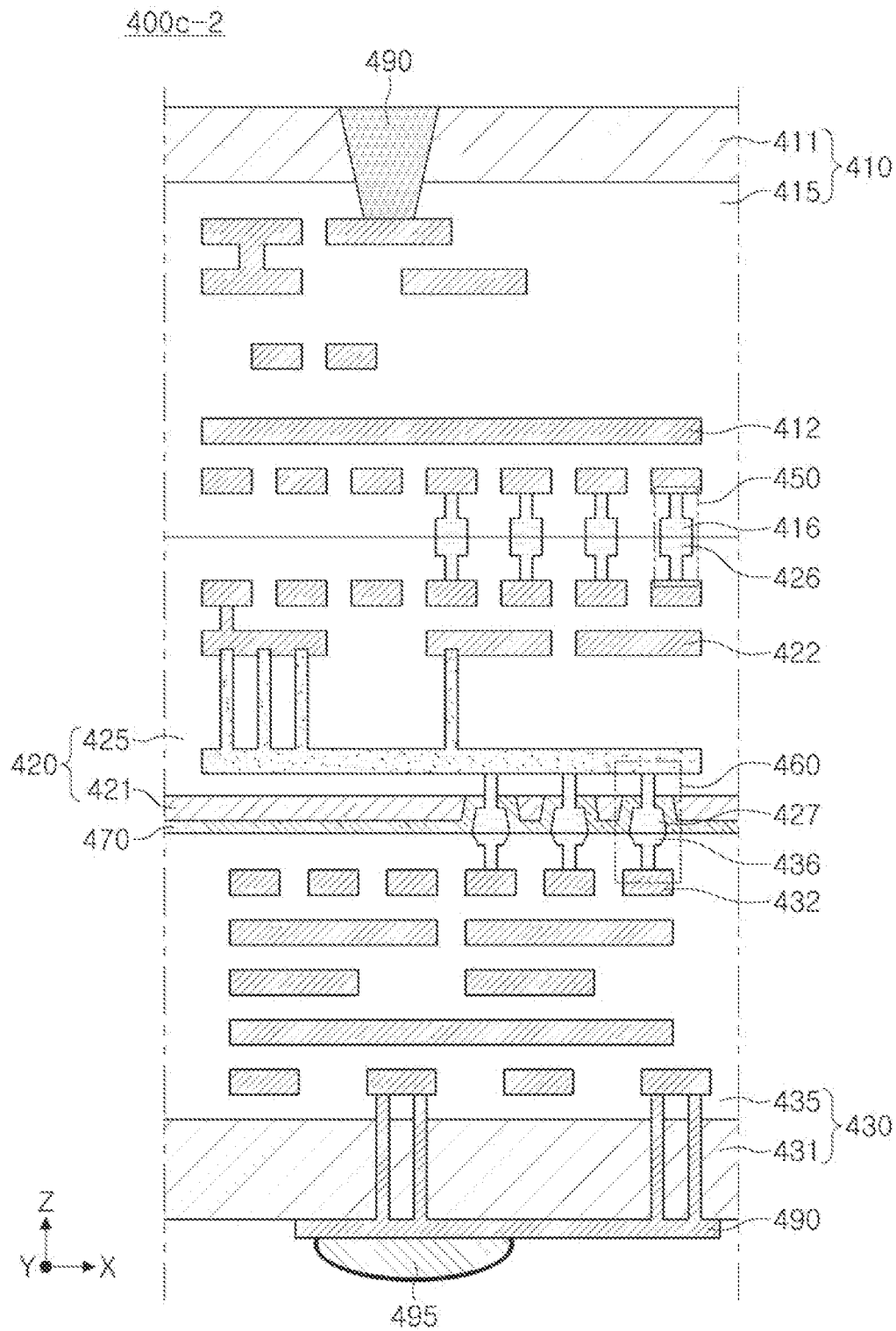
Figure 12C:
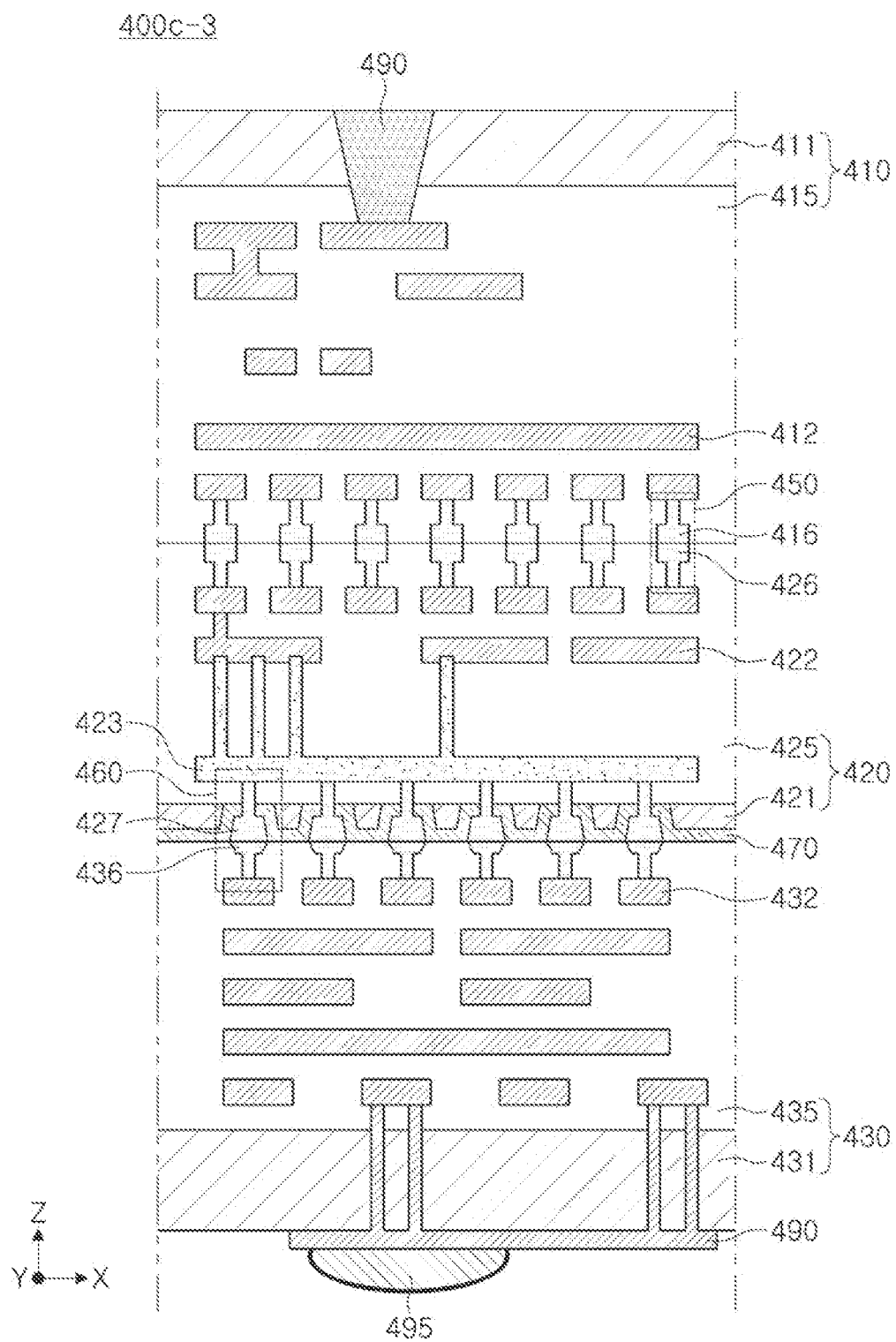

FIGS. 11A to 11C are plan diagrams illustrating a structure of an input/output region included in an image sensor according to an example embodiment. FIGS. 12A to 12C are plan diagrams illustrating a structure of an input/output region included in an image sensor according to an example embodiment.

FIGS. 11A to 11C and FIGS. 12A to 12C illustrate example embodiments of a third region 200c including a through-silicon via 290 used as an input/output terminal in the image sensor 200 illustrated in FIG. 7. The other components may correspond to the components included in the image sensor 200.

As an example, FIGS. 11A to 11C may illustrate input/output regions 300c-1, 300c-2, and 300c-2 of the image sensor in which input/output terminals are formed in the direction of the first layer 310, and FIG. 12A to FIG. 12c may illustrate input/output regions 400c-1, 400c-2, and 400c-3 of the image sensor in which input/output terminals are formed in the direction of the third layer 430.

Referring to FIGS. 11A to 11C, the input/output regions 300c-1, 300c-2, and 300c-3 of the image sensor may include a first through-silicon via 390 extending from exposed surface of the first semiconductor substrate 311 and connected to an uppermost wiring of the first wiring 312 of the first wiring layer 315 included in the first layer 310.

Referring to FIG. 11A, in the input/output region 300c-1 of the image sensor, the first bonding structure 350 and the second bonding structure 360 may not overlap each other in the first direction (e.g., the Z direction). The first bonding structure 350 and the second bonding structure 360 may bond and support the layers. Accordingly, by arranging the first bonding structure 350 and the second bonding structure 360 to not overlap each other, stability may improve, such as reducing bending which may occur in the operation of the image sensor.

In the input/output region 300c-1 of the image sensor illustrated in FIG. 11A, the first through-silicon via 390 may be disposed to not overlap the first bonding structure 350 in the first direction, thereby improving stability of the image sensor. However, embodiments are not limited thereto, and the arrangement of the first through-silicon via 390, the first bonding structure 350, and the second bonding structure 360 may not be limited the illustrated example.

For example, referring to FIG. 11B, the first bonding structure 350 and the second bonding structure 360 may be disposed in positions overlapping each other in the first direction. Referring to FIG. 11C, a plurality of the first bonding structure 350 and a plurality of the second bonding structure 360 may be disposed in arbitrary positions regardless of the first through-silicon via 390. Although not illustrated in FIGS. 11A to 11C, the first through-silicon via 390 may be disposed to overlap the first bonding structure 350 in the first direction.

Referring FIGS. 12A to 12C, the input/output regions 400c-1, 400c-2, and 400c-3 of the image sensor may include a second through-silicon via 490 extending from exposed surface of the third semiconductor substrate 431 and connected to a lowermost wiring of the third wirings 432 of the third wiring layer 435 included in the third layer 430. For example, differently from the first through-silicon via 390, the second through-silicon via 490 may only penetrate the third semiconductor substrate 431 and may be connected to an external entity by a solder ball 495. However, embodiments are not limited thereto.

Similarly to the example in FIG. 11A, referring to FIG. 12A, the first bonding structure 450, the second bonding structure 460, and the solder ball 495 in the input/output region 400c-1 of the image sensor may be arranged in a zigzag pattern in the first direction to improve stability of the image sensor. However, embodiments are not limited thereto, and referring to FIGS. 12B and 12C, the first bonding structure 450 and the second bonding structure 460 may be disposed to overlap each other in the first direction or may be arbitrarily arranged. The image sensor in an example embodiment may include an input/output region including at least one of the first through-silicon via 390 and the second through-silicon via 490.

Figure 13:
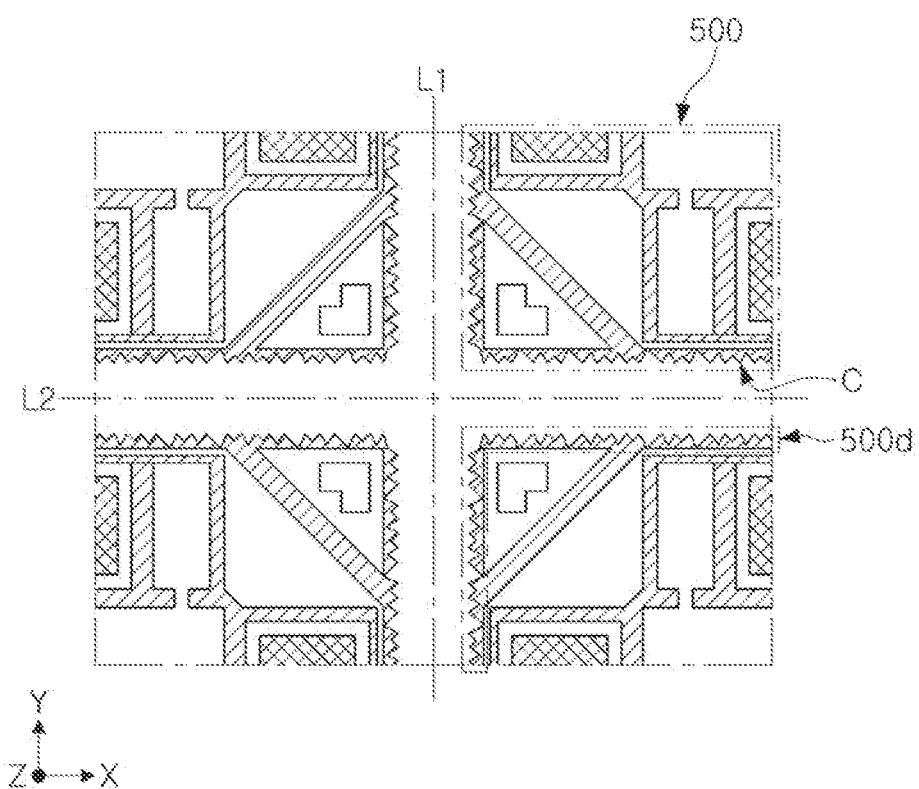
FIGS. 13 and 14 are a diagram viewed from the above and a plan diagram illustrating a structure of a barrier region included in an image sensor according to an example embodiment.
Figure 14:
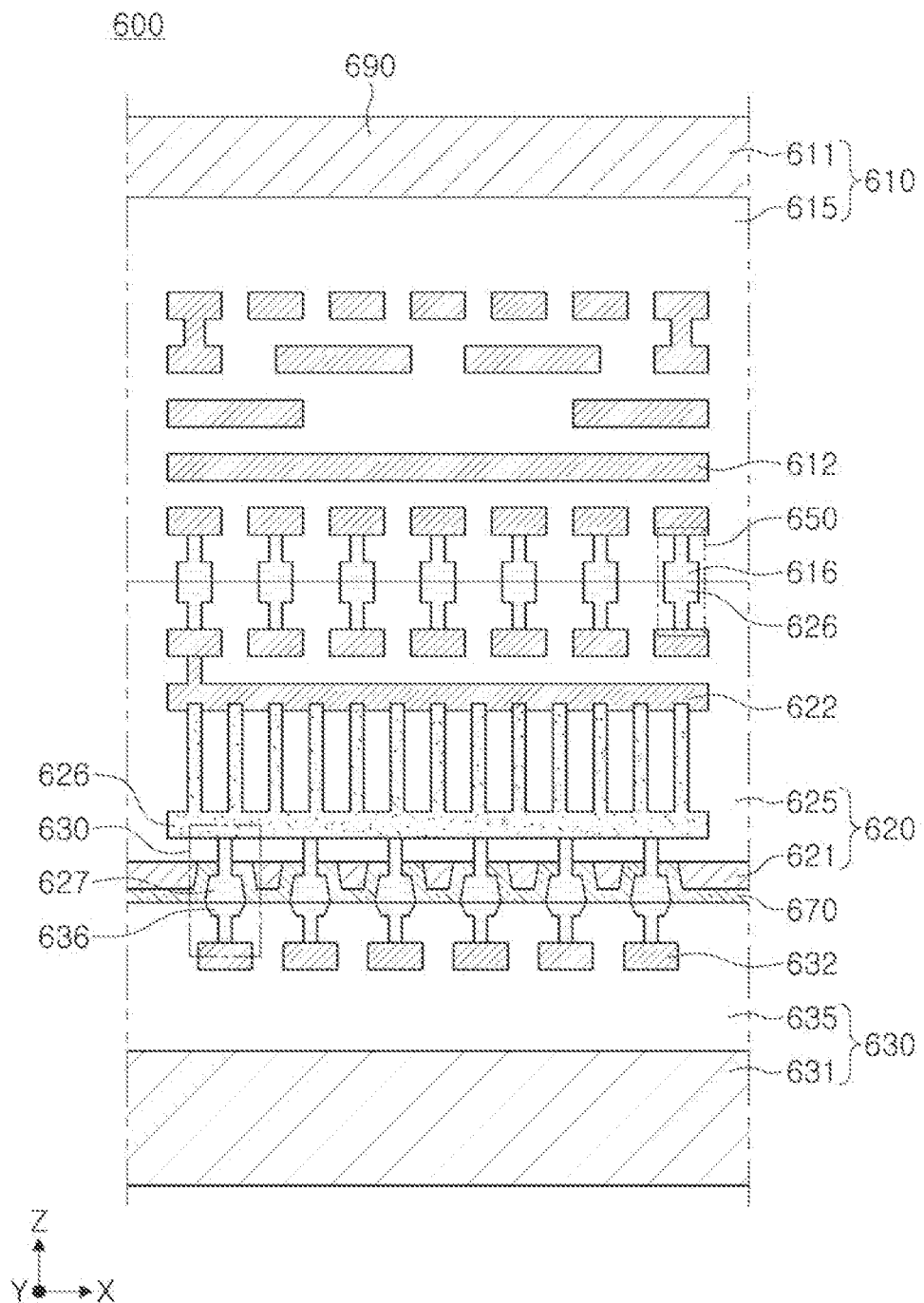

FIGS. 13 and 14 are a diagram, viewed from the above, and a plan diagram illustrating a structure of a barrier region included in an image sensor according to an example embodiment.

FIG. 13 may be a diagram illustrating processes of manufacturing an image sensor in an example embodiment, viewed from the above. The process of manufacturing the image sensor may include a dicing process for separating a plurality of image sensors after manufacturing the plurality of image sensors on a substrate. For example, the plurality of image sensors formed on the substrate may be separated into individual image sensors along cut-off surfaces L1 and L2.

Referring to FIG. 13, the individual image sensors separated from each other through a dicing process may have cracks on the cut-off surface. However, moisture may penetrate into an integrated circuit through the cut-off surface. The cracks C formed in the image sensor and/or moisture penetrating into the image sensor may cause defects in the image sensor.

The image sensor in an example embodiment may include a barrier region 500d disposed adjacent to the cut-off surfaces L1 and L2. For example, the barrier region 500d illustrated in FIG. 13 may correspond to the fourth region 200d included in the image sensor 200 illustrated in FIG. 7. The barrier region 500d may protect the integrated circuit such that moisture does not penetrate into the integrated circuit including the plurality of transistors or the cracks C are not formed therein. Accordingly, the fourth region 200d corresponding to the barrier region 500d may be disposed to surround the first region 200a to the third region 200c.

Referring to FIGS. 7 and 14 together, the barrier region 600d included in the image sensor in an example embodiment may work as a crack stopper CS and/or a moisture oxidation barrier MOB. For example, the configuration of the barrier region 600d may correspond to the fourth region 200d included in the image sensor 200. The arrangement of the first bonding structure 650 and the second bonding structure 660 included in the barrier region 600d may be the same as the arrangement of the first bonding structure 250 and the second bonding structure 260 included in the second region 200b included in the image sensor 200.

Figure 15:
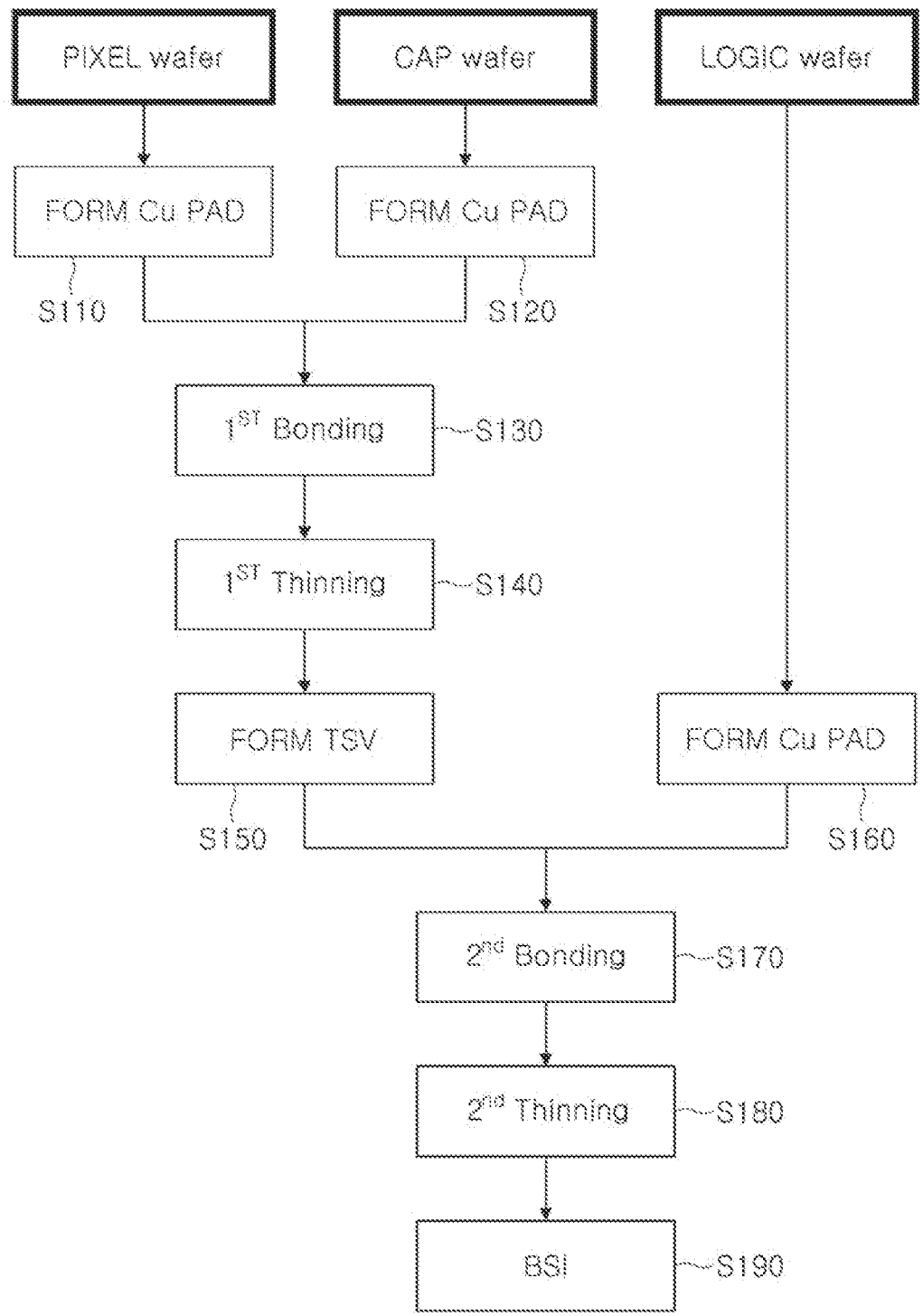
FIG. 15 is a flowchart illustrating a method of manufacturing an image sensor according to an example embodiment.

FIG. 15 is a flowchart illustrating a method of manufacturing an image sensor according to an example embodiment.

Referring to FIG. 15, a first layer (PIXEL wafer), a second layer (CAP wafer), and a third layer (LOGIC wafer) may be manufactured as a single image sensor by being bonded to each other through a plurality of processes included in the method of manufacturing an image sensor in an example embodiment.

The image sensor may include a first layer (PIXEL wafer) including a pixel unit in which a plurality of unit pixels are arranged, a second layer (CAP wafer) including a plurality of transistors and a plurality of capacitors for implementing a global shutter operation, and a third layer including a logic circuit (LOGIC wafer). For example, the method of manufacturing an image sensor in an example embodiment may start with forming the first layer (PIXEL wafer), the second layer (CAP wafer), and the third layer (LOGIC wafer) each including a semiconductor substrate and a wiring layer.

A plurality of first bonding metals exposed externally may be formed on one surface of the first wiring layer included in the formed first layer (PIXEL wafer) (S110). A plurality of second bonding metals exposed externally may also be formed on one surface of the second wiring layer included in the second layer (CAP wafer) (S120), and a plurality of third bonding metals exposed externally may be formed on one surface of the third wiring layer included in the third layer (LOGIC wafer) (S160). For example, the plurality of bonding metals may be implemented as Cu PAD.

The plurality of bonding metals formed on the first layer (PIXEL wafer) and the plurality of bonding metals formed on the second layer (CAP wafer) may be bonded to each other by a primary bonding process (S130). For example, the first layer (PIXEL wafer) and the second layer (CAP wafer) may form a first bonding structure by the first bonding process. By the first bonding process, the first wiring layer included in the first layer (PIXEL wafer) may be bonded to and may oppose the second wiring layer included in the second layer (CAP wafer).

After forming the first bonding structure, a first thinning process may be performed on the second semiconductor substrate included in the second layer (CAP wafer) (S140). For example, the first thinning process may be performed by polishing the back surface of the semiconductor substrate on which the second wiring layer is not stacked. The second semiconductor substrate may be polished to have a predetermined thickness through the first thinning process. For example, in the image sensor in an example embodiment, the second semiconductor substrate may have a thickness of about 10 nm to 2 µm. However, embodiments are not limited thereto.

After the first thinning process is completed, a bonding via may be formed in the second layer (CAP wafer) (S150). The bonding via may be formed to be in contact with the second lower wiring of the second wiring layer and may penetrate the second semiconductor substrate. The bonding via may be bonded to a third bonding metal formed on a third layer (LOGIC wafer), thereby forming a second bonding structure (S170). For example, the process of forming the second bonding structure may be a secondary bonding process.

After forming the second bonding structure, a second thinning process may be performed on the first semiconductor substrate included in the first layer (PIXEL wafer) (S180). For example, the secondary thinning process may be performed by polishing the back surface of the semiconductor substrate on which the first wiring layer is not stacked. The first semiconductor substrate may be polished to have a predetermined thickness through the secondary thinning process.

After the secondary thinning process is completed, a process of forming an image sensor of a backside illumination (BSI) method in which a microlens for allowing light to be incident is disposed on the back surface of the polished first semiconductor substrate may be performed (S190). Through processes S110 to S190, an image sensor in which the first layer (PIXEL wafer), the second layer (CAP wafer), and the third layer (LOGIC wafer) are bonded to each other may be manufactured.

FIGS. 16A to 16E are diagrams illustrating a method of manufacturing an image sensor according to an example embodiment.

Figure 16A:
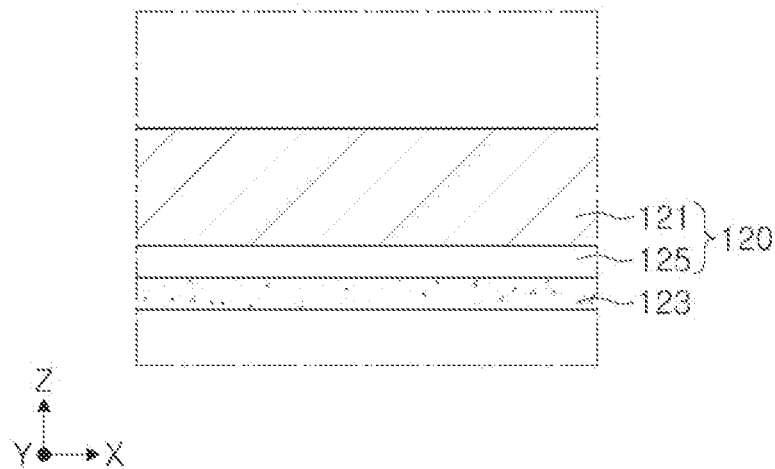
FIGS. 16A, 16B, 16C, 16D, and 16E are diagrams illustrating a method of manufacturing an image sensor according to an example embodiment.

FIGS. 16A to 16E may be cross-sectional diagrams illustrating the image sensor by subdividing process S150 for forming the bonding via illustrated in FIG. 15 and illustrating the processes in order. Referring to FIG. 16A, the second layer 120 may include a second semiconductor substrate 121 and a second wiring layer 125 stacked on the second semiconductor substrate 121. The second wiring layer 125 may include a second lower wiring 123.

Figure 16B:
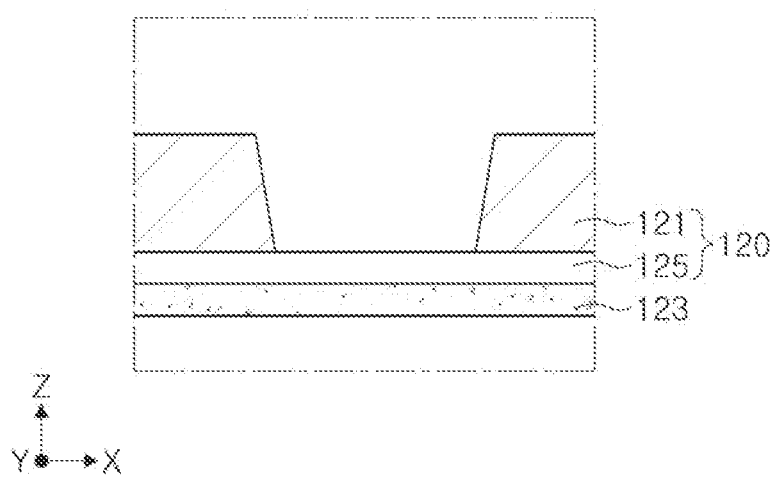

Referring to FIG. 16B, after the first thinning process is completed, a first etching may be performed on the second semiconductor substrate 121 in a position in which a bonding via is formed. For example, the first etching may be performed until the second wiring layer 125 is exposed.

Figure 16C:
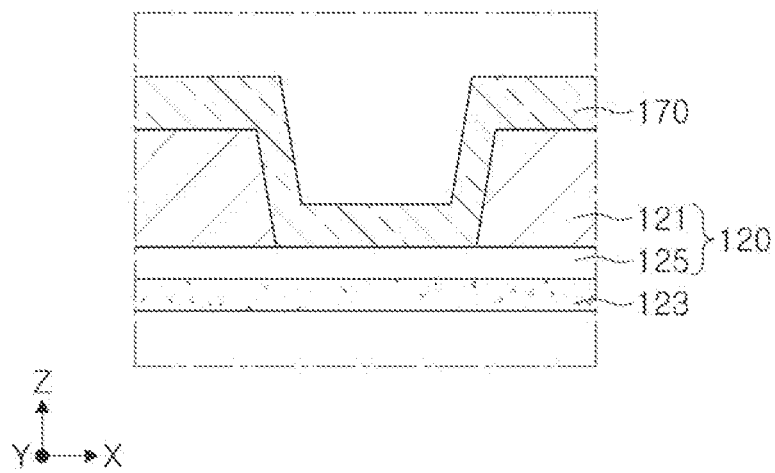

Referring to FIG. 16C, a spacer layer 170 may be formed on the second semiconductor substrate 121 and the second wiring layer 125 exposed by the first etching. Another layer having a structure different from that of the spacer layer 170 may be first formed on the second semiconductor substrate 121 before the spacer layer 170 is formed.

Figure 16D:
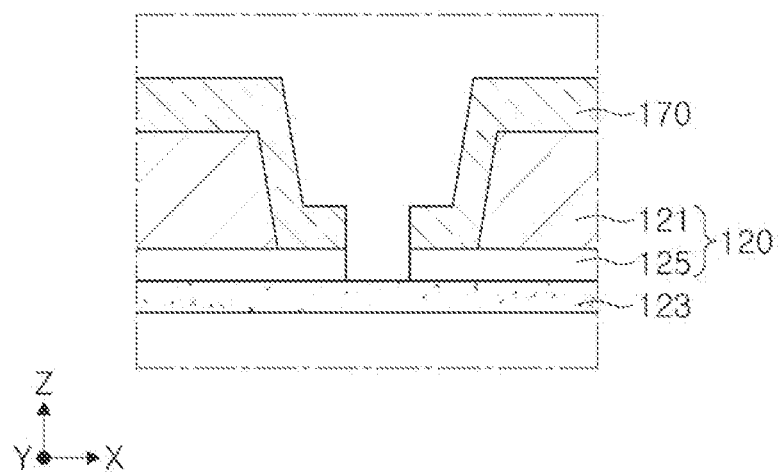

Referring to FIG. 16D, a second etching may be performed on a portion of the spacer layer 170 and the second wiring layer 125. For example, the second etching may be performed until the second lower wiring 123 is exposed. A width in the second direction in which the second etching is performed may be smaller than a width in which the first etching is performed.

Figure 16E:
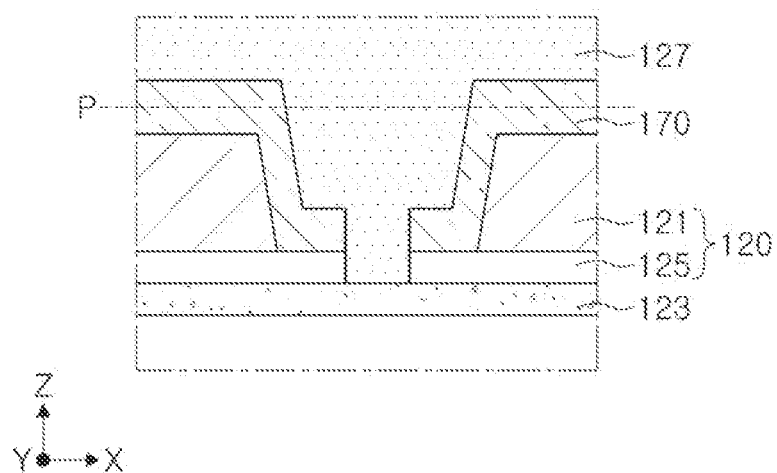

Referring to FIG. 16E, a via structure 127 may be formed on the second etched spacer layer 170 and the second wiring layer 125 having gone through the second etching. For example, the via structure 127 may be connected to the second lower wiring 123 exposed by the second etching. The via structure 127 may be formed of Cu, and may be polished along a processed surface P. As an example, the polished via structure 127 may be a bonding via.

However, the process of manufacturing the image sensor illustrated in FIGS. 16A to 16E is merely an example embodiment and embodiments are not limited thereto. For example, to manufacture the image sensor in an example embodiment, another process may be added between processes, or a portion of the existing processes may be omitted.

Figure 17:
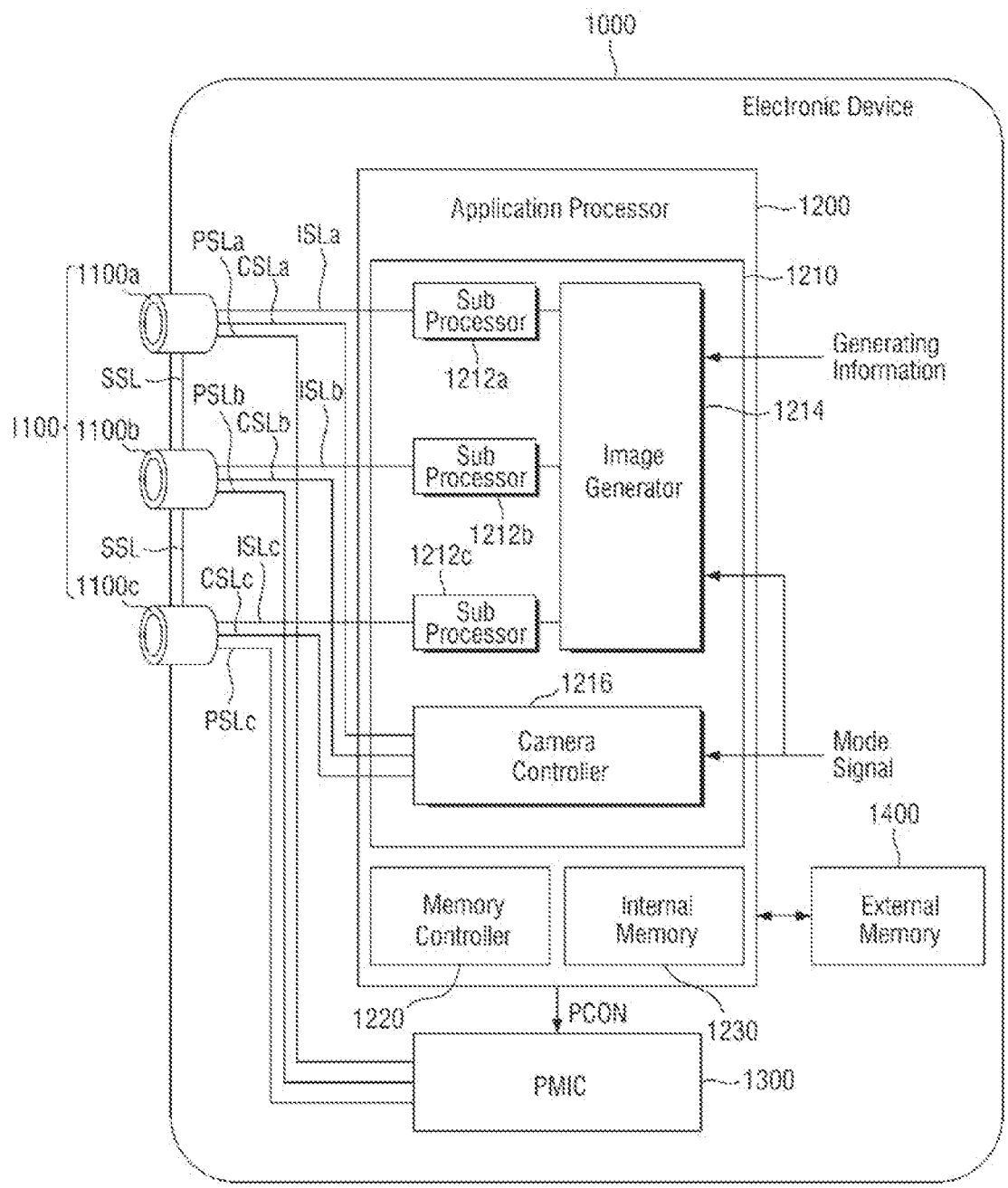
FIGS. 17 and 18 are diagrams illustrating an electrical device including an image sensor according to an example embodiment.
Figure 18:
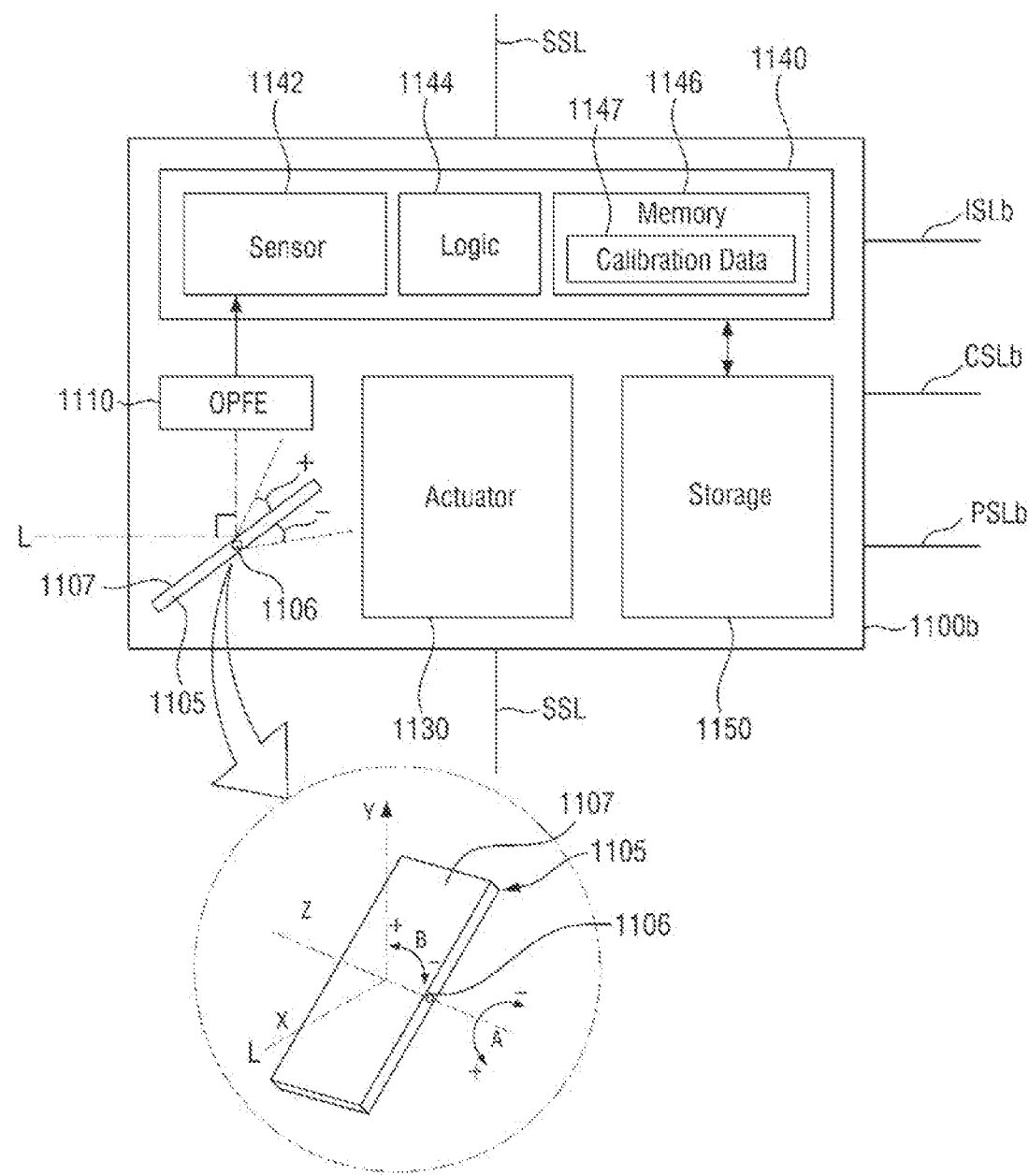

FIGS. 17 and 18 are diagrams illustrating an electrical device including an image sensor according to an example embodiment.

Referring to FIG. 17, an electronic device 1000 may include a camera module group 1100, an application processor 1200, a PMIC 1300, and an external memory 1400.

The camera group 1100 may include a plurality of cameras 1100*a*, 1100*b*, and 1100*c*. In the drawing, an example embodiment in which three cameras 1100*a*, 1100*b*, and 1100*c* are disposed, but embodiments are not limited thereto. In example embodiments, the camera group 1100 may be modified to include only two cameras. Also, in example embodiments, the camera group 1100 may be modified to include n (n is a natural number equal to or greater than 4) number of cameras. In one example embodiment, at least one of the plurality of cameras 1100*a*, 1100*b*, and 1100*c* included in the camera group 1100 may also include the image sensor in one of the aforementioned example embodiments described with reference to FIGS. 1 to 16E.

Hereinafter, the detailed configuration of the camera 1100*b* will be described in greater detail with reference to FIG. 18, and the description below will also be applied to the other cameras 1100*a* and 1100*b* in example embodiments.

Referring to FIG. 18, the camera 1100*b* may include a prism 1105, an optical path folding element 1110 (hereinafter, "OPFE"), an actuator 1130, an image sensing device 1140, and a storage unit 1150.

The prism 1105 may include a reflective surface 1107 of a light reflective material to modify the path of light L incident from the outside.

In example embodiments, the prism 1105 may change the path of light L incident in the first direction X to be directed in the second direction Y perpendicular to the first direction X. The prism 1105 may also rotate the reflective surface 1107 of the light reflective material in the A direction about a central axis 1106 or may rotate the central axis 1106 in the B direction such that the path of the light L incident in the first direction (X) may change to be directed in the second vertical direction Y. In this case, the OPFE 1110 may also move in a third direction (Z) perpendicular to the first direction (X) and the second direction (Y).

In example embodiments, as illustrated, a maximum rotation angle of the prism 1105 in the A direction may be 15 degrees or less in the positive (+) A direction, and may be greater than 15 degrees in the negative (−) A direction, but embodiments are not limited thereto.

In example embodiments, the prism 1105 may move in a positive (+) or negative (−) B direction by around 20 degrees, or between 10 degrees and 20 degrees, or between 15 degrees and 20 degrees, and as for the moving angle, the prism 1105 may move by the same angle in the positive (+) or negative (−) B direction or may move by a similar angle in a range of about 1 degree.

In example embodiments, the prism 1105 may move the reflective surface 1106 of a light reflective material in a third direction (e.g., the Z direction) parallel to the extending direction of the central axis 1106.

The OPFE 1110 may include, for example, an optical lens including m (where m is a natural number) number of groups. The m number of lenses may move in the second direction Y to change an optical zoom ratio of the camera module 1100*b*. For example, when a basic optical zoom ratio of the camera module 1100*b* is Z, and m number of optical lenses included in the OPFE 1110 move, the optical zoom ratio of the camera module 1100*b* may be 3Z, 5Z, or 5Z or higher.

The actuator 1130 may move the OPFE 1110 or an optical lens (hereinafter, referred to as an optical lens) to a specific position. For example, the actuator 1130 may adjust the position of the optical lens such that the image sensor 1142 may be disposed at a focal length of the optical lens for accurate sensing.

The image sensing device 1140 may include an image sensor 1142, a control logic 1144 and a memory 1146. The image sensor 1142 may sense an image of a sensing target using light L provided through an optical lens. The control logic 1144 may control overall operation of the camera module 1100*b*. For example, the control logic 1144 may control the operation of the camera module 1100*b* according to a control signal provided through a control signal line CSLb.

The memory 1146 may store information necessary for operation of the camera 1100*b*, such as calibration data 1147. The calibration data 1147 may include information necessary for the camera 1100*b* to generate image data using light L provided from the outside. The calibration data 1147 may include, for example, information on a degree of rotation, information on a focal length, information on an optical axis, and the like, described above. When the camera 1100*b* is implemented as a multi-state camera of which a focal length changes depending on the position of the optical lens, the calibration data 1147 may include information on focal length values for each position (or each state) of the optical lens and autofocusing.

The storage unit 1150 may store image data sensed through the image sensor 1142. The storage unit 1150 may be disposed externally on the image sensing device 1140 and may be implemented to be stacked with a sensor chip forming the image sensing device 1140. In example embodiments, the storage unit 1150 may be implemented as an electrically erasable programmable read-only memory (EEPROM), but embodiments are not limited thereto.

Referring to FIGS. 17 and 18 together, in example embodiments, each of the plurality of cameras 1100*a*, 1100*b*, and 1100*c* may include an actuator 1130. Accordingly, each of the plurality of cameras 1100*a*, 1100*b*, and 1100*c* may include the same or different calibration data 1147 according to the operation of the actuator 1130 included therein.

In example embodiments, one camera (e.g., 1100*b*) among the plurality of cameras 1100*a*, 1100*b*, and 1100*c* may be implemented as a folded lens type camera including the prism 1105 and OPFE 1110 described above, and the other cameras (e.g., 1100*a* and 1100*c*) may be a vertical type camera which does not include the prism 1105 and OPFE 1110, but embodiments are not limited thereto.

In example embodiments, one camera (e.g., 1100*b*) among the plurality of cameras 1100*a*, 1100*b*, and 1100*c* may be implemented as a vertical-type depth camera which may extract depth information using infrared ray (IR), for example. In this case, the application processor 1200 may merge the image data provided from the depth camera with the image data provided from another camera (e.g., the camera 1100*a* or 1100*c*) and may generate a 3D depth image.

In example embodiments, at least two cameras (e.g., 1100a and 1100b) among the plurality of cameras 1100a, 1100b, and 1100c may have different fields of view. In this case, for example, the optical lenses of at least two camera (e.g., 1100a and 1100b) among the plurality of cameras 1100a, 1100b, and 1100c may be different from each other, but embodiments are not limited thereto.

In example embodiments, fields of view of the plurality of cameras 1100a, 1100b, and 1100c may also be different from each other. In this case, the optical lenses included in each of the plurality of cameras 1100a, 1100b, and 1100c may also be different from each other, but embodiments are not limited thereto.

In example embodiments, the plurality of cameras 1100a, 1100b, and 1100c may be configured to be physically isolated from each other. For example, a sensing area of one image sensor 1142 may not be divided and used by the plurality of cameras 1100a, 1100b, and 1100c, and an independent image sensor 1142 may be disposed in each of the plurality of cameras 1100a, 1100b, and 1100c.

Referring back to FIG. 17, the application processor 1200 may include an image processing device 1210, a memory controller 1220, and an internal memory 1230. The application processor 1200 may be implemented to be separated from the plurality of cameras 1100a, 1100b, and 1100c. For example, the application processor 1200 and the plurality of cameras 1100a, 1100b, and 1100c may be implemented to be separated from each other as separate semiconductor chips.

The image processing apparatus 1210 may include a plurality of sub-image processors 1212a, 1212b, and 1212c, an image generator 1214, and a camera controller 1216.

The image processing apparatus 1210 may include a plurality of sub-image processors 1212a, 1212b, and 1212c corresponding to the number of the plurality of cameras 1100a, 1100b, and 1100c.

Image data generated by each of the cameras 1100a, 1100b, and 1100c may be provided to corresponding sub-image processors 1212a, 1212b, and 1212c through image signal lines ISLa, ISLb, and ISLc separated from each other. For example, image data generated by the camera 1100a may be provided to the sub-image processor 1212a through an image signal line ISLa, the image data generated by the camera 1100b may be provided to the sub-image processor 1212b through the image signal line ISLb, and the image data generated by the camera 1100c may be provided to the sub-image processor 1212c through the image signal line ISLc. The image data transmission may be performed using, for example, a camera serial interface (CSI) based on a mobile industry processor interface (MIPI), but embodiments are not limited thereto.

In example embodiments, one sub-image processor may be arranged to correspond to a plurality of cameras. For example, the sub-image processor 1212a and the sub-image processor 1212c may not be implemented to be separated from each other as illustrated, and may be implemented to be integrated into a single sub-image processor, and the image data provided by the camera 1100a and the camera 1100c may be selected through a selection device (e.g., a multiplexer) and may be provided to the integrated sub-image processor.

The image data provided to each of the sub-image processors 1212a, 1212b, and 1212c may be provided to the image generator 1214. The image generator 1214 may generate an output image using the image data provided by each of the sub-image processors 1212a, 1212b, and 1212c according to image generating information or a mode signal.

For example, the image generator 1214 may generate an output image by merging at least portions of the image data generated by the cameras 1100a, 1100b, and 1100c having different fields of view according to the image generating information or a mode signal. The image generator 1214 may also generate an output image by selecting one of the image data generated by the cameras 1100a, 1100b, and 1100c having different fields of view according to image generation information or a mode signal.

In example embodiments, the image generating information may include a zoom signal or zoom factor. In example embodiments, the mode signal may be also, for example, a signal based on a mode selected by a user.

When the image generating information is a zoom signal (zoom factor), and the cameras 1100a, 1100b, and 1100c have different fields of view, the image generator 1214 may perform different operations depending on types of zoom signals. For example, when the zoom signal is a first signal, the image data output by the camera 1100a may be merged with the image data output by the camera 1100c, and an output image may be generated using the merged image signal and the image data output by the camera 1100b which has not been used in the merging. When the zoom signal is a second signal different from the first signal, the image generator 1214 may not perform the image data merging, and may generate an output image by selecting one of the image data output by each camera 1100a, 1100b, and 1100c. However, embodiments are not limited thereto, and a method of processing the image data may be varied if desired.

In example embodiments, the image generator 1214 may receive a plurality of image data having different exposure times from at least one of the plurality of sub-image processors 1212a, 1212b, and 1212c, and may perform high dynamic range (HDR) processing thereon, such that merged image data with an increased dynamic range may be generated.

The camera controller 1216 may provide a control signal to each of the cameras 1100a, 1100b, and 1100c. The control signal generated from the camera controller 1216 may be provided to corresponding cameras 1100a, 1100b, and 1100c through control signal lines CSLa, CSLb, and CSLc separated from each other.

One of the plurality of cameras 1100a, 1100b, and 1100c may be designated as a master camera (e.g., 1100b) according to image generating information including a zoom signal, or a mode signal, and the other cameras (e.g., 1100a and 1100c) may be designated as slave cameras. The above-described information may be included in a control signal and may be provided to corresponding cameras 1100a, 1100b, and 1100c through control signal lines CSLa, CSLb, and CSLc separated from each other.

Cameras operating as masters and slaves may change according to a zoom factor or an operating mode signal. For example, when the field of view of the camera 1100a is wider than that of the camera 1100b, and the zoom factor exhibits a low zoom ratio, the camera 1100b may operate as a master, and the camera 1100a may operate a slave. Conversely, when the zoom factor exhibits a high zoom ratio, the camera 1100a may operate as a master and the camera 1100b may operate as a slave.

In example embodiments, a control signal provided from the camera controller 1216 to each of the cameras 1100a, 1100b, and 1100c may include a sync enable signal. For example, when the camera 1100b is a master camera and the cameras 1100a and 1100c are slave cameras, the camera controller 1216 may transmit a sync enable signal to the camera 1100b. The camera 1100b receiving the sync enable signal may generate a sync signal on the basis of the provided sync enable signal, and may transmit the generated sync signal to the cameras 1100a and 1100c. The camera 1100b and the cameras 1100a and 1100c may be synchronized with the sync signal and may transmit image data to the application processor 1200.

In example embodiments, a control signal provided from the camera controller 1216 to the plurality of cameras 1100a, 1100b, and 1100c may include mode information according to the mode signal. The plurality of cameras 1100a, 1100b, and 1100c may operate in a first operating mode and a second operating mode in relation to a sensing speed on the basis of the mode information.

In the first operating mode, the plurality of cameras 1100a, 1100b, and 1100c may generate an image signal at a first rate (e.g., may generate an image signal at a first frame rate), may encode the image signal at a second rate higher than the first rate (e.g., may encode an image signal of a second frame rate higher than a first frame rate), and may transmit the encoded image signal to the application processor 1200. In this case, the second speed may be 30 times or less of the first speed.

The application processor 1200 may store the received image signal, the encoded image signal, in the internal memory 1230 provided therein or the external memory 1400 disposed externally of the application processor 1200, may read out the encoded image signal from the internal memory 1230 or the external memory 1400, and may display image data generated on the basis of the decoded image signal. For example, a corresponding sub-processor among the plurality of sub-processors 1212a, 1212b, and 1212c of the image processing apparatus 1210 may perform decoding, and may also perform image processing on the decoded image signal.

In the second operating mode, the plurality of cameras 1100a, 1100b, and 1100c may generate an image signal at a third rate lower than the first rate (e.g., generate an image signal of a third frame rate lower than the first frame rate), and may transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power voltage, to each of the plurality of cameras 1100a, 1100b, and 1100c. For example, the PMIC 1300 may supply first power to the camera module 1100a through the power signal line PSLa under control of the application processor 1200, may supply second power to the camera 1100b through the power signal line PSLb, and may supply third power to the camera module 1100c through the power signal line PSLc.

The PMIC 1300 may generate power corresponding to each of the plurality of cameras 1100a, 1100b, and 1100c in response to a power control signal PCON from the application processor 1200, and may also adjust a level of power. The power control signal PCON may include a power adjustment signal for each operating mode of the plurality of cameras 1100a, 1100b, and 1100c. For example, the operating mode may include a low power mode, and in this case, the power control signal PCON may include information on a camera module operating in a low power mode and a determined power level. Levels of power provided to the plurality of cameras 1100a, 1100b, and 1100c may be the same or different. A level of power may also be dynamically changed.

According to the aforementioned example embodiments, the image sensor may have a stack structure including a first layer, a second layer, and a third layer, and the second layer and the third layer may be bonded to each other by a bonding structure in which a contact via is in direct contact with a bonding metal formed of copper. Accordingly, noise of the image sensor may be reduced, a bonding structure may improve, and integration density of the image sensor may improve.

While example embodiments have been illustrated and described above, it will be apparent to those skilled in the art that modifications and variations could be made without departing from the scope of the present disclosure as defined by the appended claims and their equivalents.

What is claimed is:

1. An image sensor, comprising:
a first layer comprising a first semiconductor substrate comprising a pixel unit in which a plurality of unit pixels are provided, and a first wiring layer provided on the first semiconductor substrate;
a second layer comprising a second semiconductor substrate on which a plurality of transistors configured to operate a global shutter operation are provided, and a second wiring layer provided on the second semiconductor substrate, and provided on the first layer such that the first wiring layer and the second wiring layer oppose each other in a first direction;
a plurality of first bonding structures bonding the first layer to the second layer based on a first bonding metal exposed on a surface of the first wiring layer being in contact with a second bonding metal exposed on a surface of the second wiring layer;
a third layer comprising a third semiconductor substrate on which a logic circuit is provided, and a third wiring layer provided on the third semiconductor substrate, and bonded to the second layer such that the second semiconductor substrate and the third wiring layer oppose each other in the first direction; and
a plurality of second bonding structures extending from the second wiring layer, and bonding the second layer to the third layer based on a bonding via penetrating the second semiconductor substrate being in contact with a third bonding metal exposed to a surface of the third wiring layer.

2. The image sensor of claim 1, wherein a transfer transistor is provided on the first semiconductor substrate, and transistors included in a pixel circuit separate from the transfer transistor are provided on the second semiconductor substrate.

3. The image sensor of claim 1, wherein transistors included in a pixel circuit comprising a transfer transistor, a reset transistor, and a drive transistor are provided on the first semiconductor substrate.

4. The image sensor of claim 1, wherein an extended length of the first bonding metal is different from an extended length of the second bonding metal in a second direction perpendicular to the first direction.

5. The image sensor of claim 1, wherein extended lengths of the first bonding metal and the second bonding metal included in at least one of the plurality of first bonding structures in a second direction perpendicular to the first direction are different from extended lengths of the first bonding metal and the second bonding metal included in the other of the plurality of first bonding structures in the second direction.

6. The image sensor of claim 1, wherein an extended length of the third bonding metal included in at least one of the plurality of second bonding structures is different from an extended length of the third bonding metal included in the other of the plurality of second bonding structures in a second direction perpendicular to the first direction.

7. The image sensor of claim 1, wherein a thickness of the second semiconductor substrate is equal to or greater than 10 nm and equal to or less than 2 μm in the first direction.

8. The image sensor of claim 1, wherein a lowermost wiring of the second wiring layer includes tungsten (W) or copper (Cu).

9. The image sensor of claim 1, wherein the first layer, the second layer, and the third layer are bonded to each other by a copper-copper (Cu—Cu) bonding method.

10. An image sensor, comprising:
a first layer comprising a first semiconductor substrate comprising a pixel unit in which a plurality of unit pixels are provided, and a first wiring layer provided on the first semiconductor substrate;
a second layer comprising a second semiconductor substrate and a second wiring layer provided on the second semiconductor substrate, and bonded to the first layer such that the first wiring layer and the second wiring layer oppose each other in a first direction; and
a third layer comprising a third semiconductor substrate and a third wiring layer provided on the third semiconductor substrate, and bonded to the second layer based on a third bonding metal exposed to one surface of the third wiring layer being in contact with a bonding via penetrating the second semiconductor substrate in the first direction,
wherein the bonding via comprises an upper via region in contact with a second wiring included in the second wiring layer and having a first width in a second direction perpendicular to the first direction, and a lower via region in contact with the third bonding metal and having a second width greater than the first width in the second direction, and
wherein a first spacer layer is provided between the second semiconductor substrate and the bonding via.

11. The image sensor of claim 10, wherein a second spacer layer is provided between the second semiconductor substrate and the third wiring layer, and
wherein a thickness of the upper via region is greater than a thickness of the second spacer layer in the first direction.

12. The image sensor of claim 11, wherein the thickness of the upper via region is between 100 nm and 800 nm.

13. The image sensor of claim 11, wherein a material of the first spacer layer is different from a material of the second spacer layer.

14. The image sensor of claim 11, wherein the first spacer layer is a composite film comprising silicon carbonitride (SiCN).

15. The image sensor of claim 11, wherein the second spacer layer is a composite film comprising metal oxide.

16. An image sensor, comprising:
a first layer, a second layer, and a third layer bonded to each other in that order in a first direction, each of the first layer, the second layer, and the third layer comprising a semiconductor substrate and a wiring layer provided on the semiconductor substrate in the first direction, and divided into a plurality of regions in a second direction and a third direction perpendicular to the first direction,
wherein the plurality of regions comprise:
a first region in which the first layer comprises a first semiconductor substrate in which a pixel unit is provided, and the second layer comprises a second semiconductor substrate;
a second region in which the first layer is bonded to the second layer by a first bonding structure, and the second layer is bonded to the third layer by a second bonding structure; and
a third region comprises at least one of a first through-silicon via extending from a surface exposed to the first semiconductor substrate and connected to a first wiring included in a first wiring layer included in the first layer, and a second through-silicon via extending from a surface exposed to a third semiconductor substrate included in the third layer and connected to a third wiring included in a third wiring layer included in the third layer.

17. The image sensor of claim 16, wherein the plurality of regions further comprises a fourth region comprising the first bonding structure and the second bonding structure, and being provided adjacent to the first region, the second region, and the third region.

18. The image sensor of claim 16, wherein the first region comprises the first bonding structure, and
wherein the third region comprises the first bonding structure and the second bonding structure.

19. The image sensor of claim 18, wherein, in the third region, the first bonding structure and the second bonding structure are provided to overlap with each other in the first direction.

20. The image sensor of claim 18, wherein the first bonding structure and the second bonding structure are provided not to overlap with each other in the first direction in the third region.

* * * * *